United States Patent
Oda

(10) Patent No.: US 8,350,263 B2
(45) Date of Patent: Jan. 8, 2013

(54) SEMICONDUCTOR PACKAGE, METHOD OF EVALUATING SAME, AND METHOD OF MANUFACTURING SAME

(75) Inventor: Takuya Oda, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 58 days.

(21) Appl. No.: 12/913,844

(22) Filed: Oct. 28, 2010

(65) Prior Publication Data

US 2011/0101349 A1 May 5, 2011

(30) Foreign Application Priority Data

Nov. 2, 2009 (JP) .................................. 2009-252170

(51) Int. Cl.
*H01L 23/34* (2006.01)

(52) U.S. Cl. ... 257/48; 257/712; 257/713; 257/E21.521; 257/E21.51; 257/E23.08; 374/44

(58) Field of Classification Search .................... 257/44, 257/712, 713, E21.521, E21.51, E23.08; 374/44

See application file for complete search history.

(56) References Cited

U.S. PATENT DOCUMENTS

2003/0150635 A1* 8/2003 Smith .......................... 174/52.2

FOREIGN PATENT DOCUMENTS

JP 57-039364 3/1982

* cited by examiner

*Primary Examiner* — Long Pham
(74) *Attorney, Agent, or Firm* — IPUSA, PLLC

(57) ABSTRACT

A semiconductor package includes a wiring board, a semiconductor device mounted on the wiring board, an electrically-conductive thermal interface material provided on the semiconductor device, a test electrode in contact with a first surface of the thermal interface material to be electrically connected to the thermal interface material, and an electrically-conductive heat spreader in contact with a second surface of the thermal interface material opposite to its first surface.

3 Claims, 21 Drawing Sheets

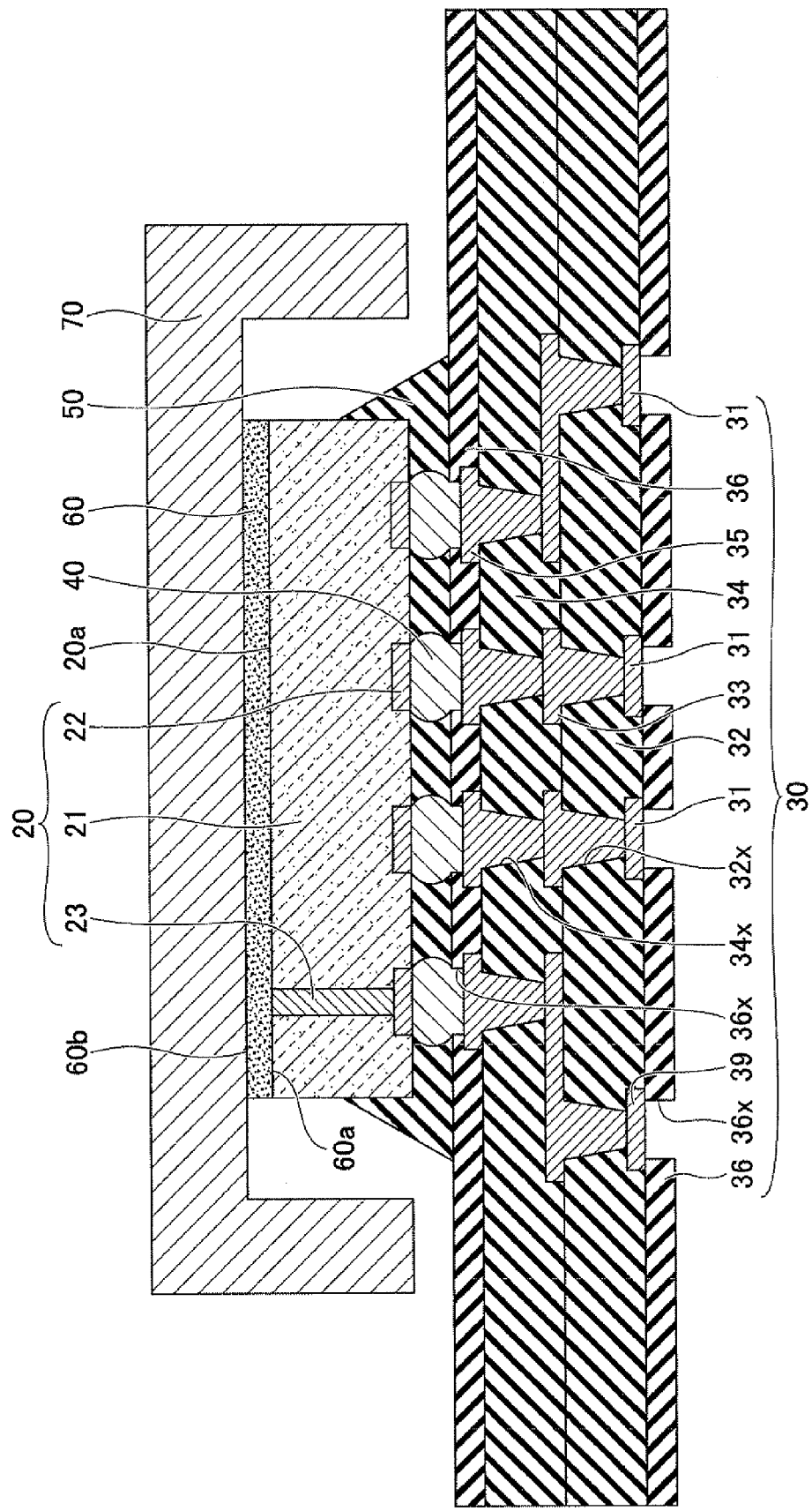

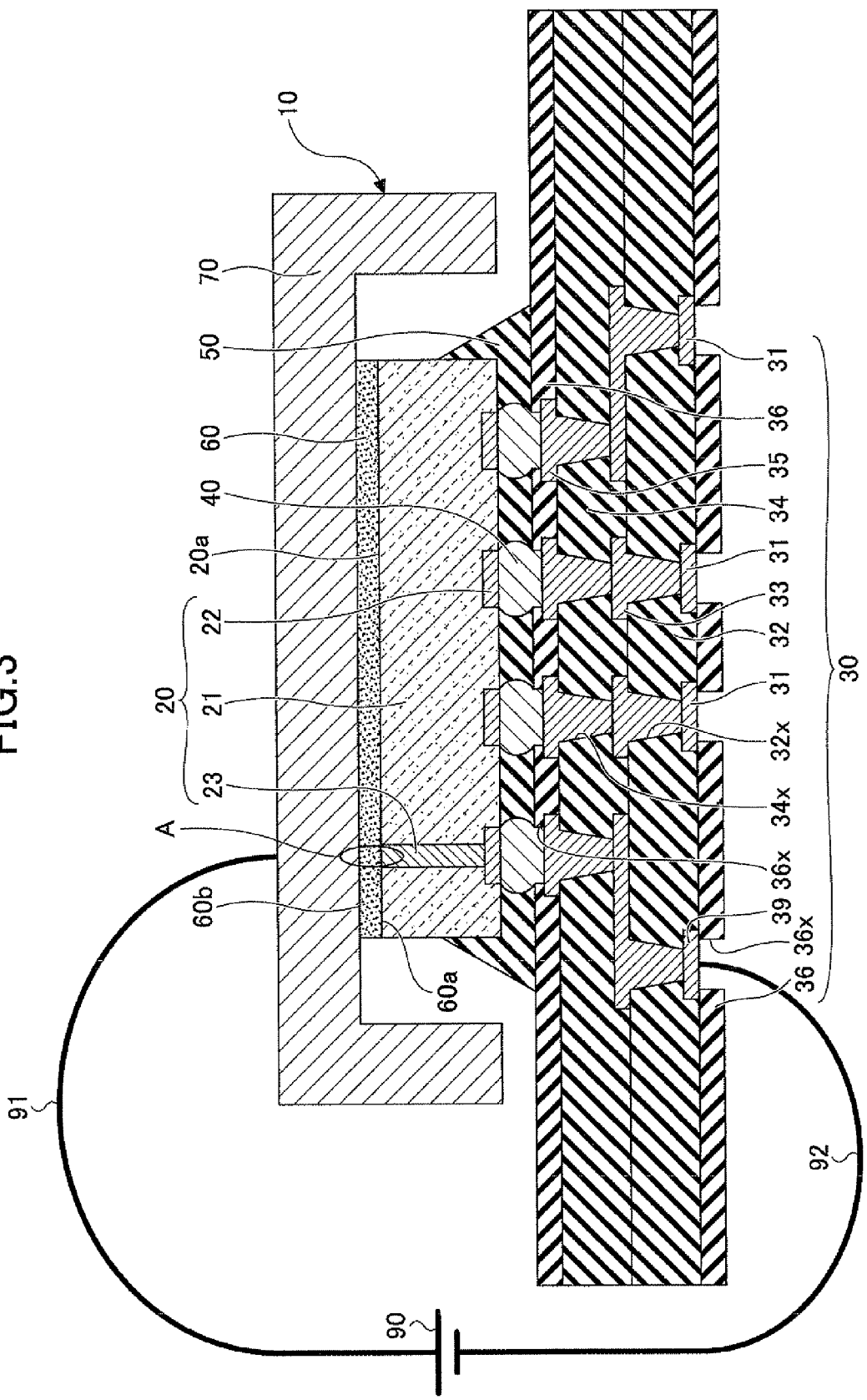

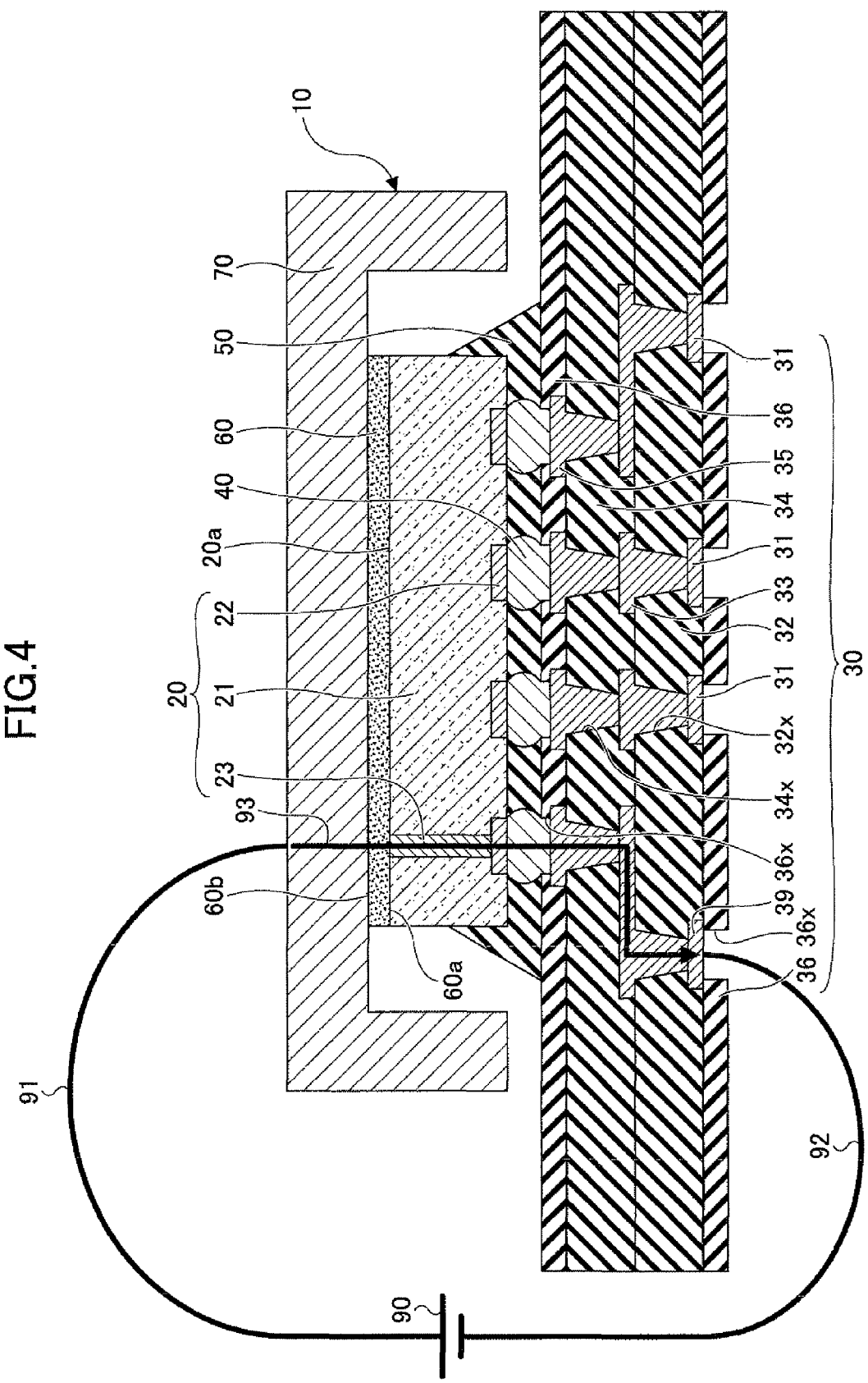

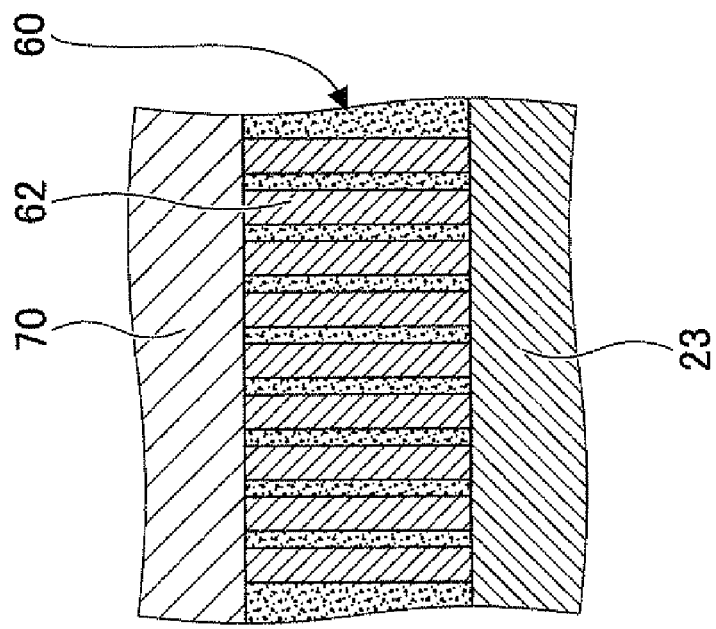
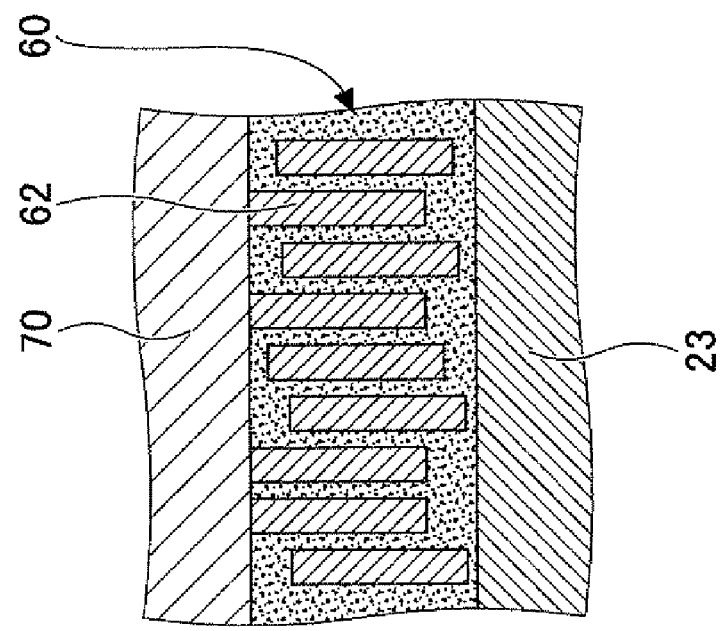

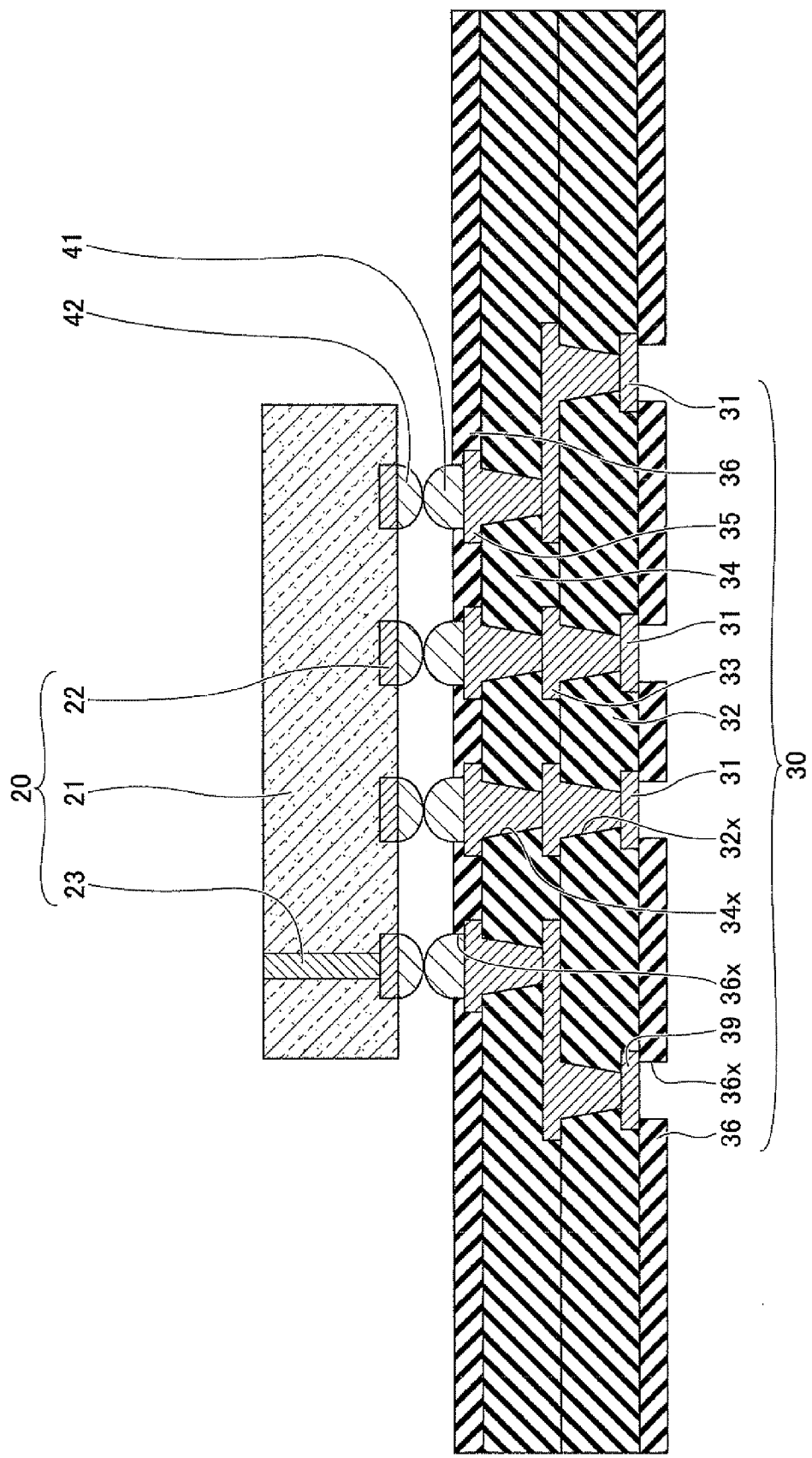

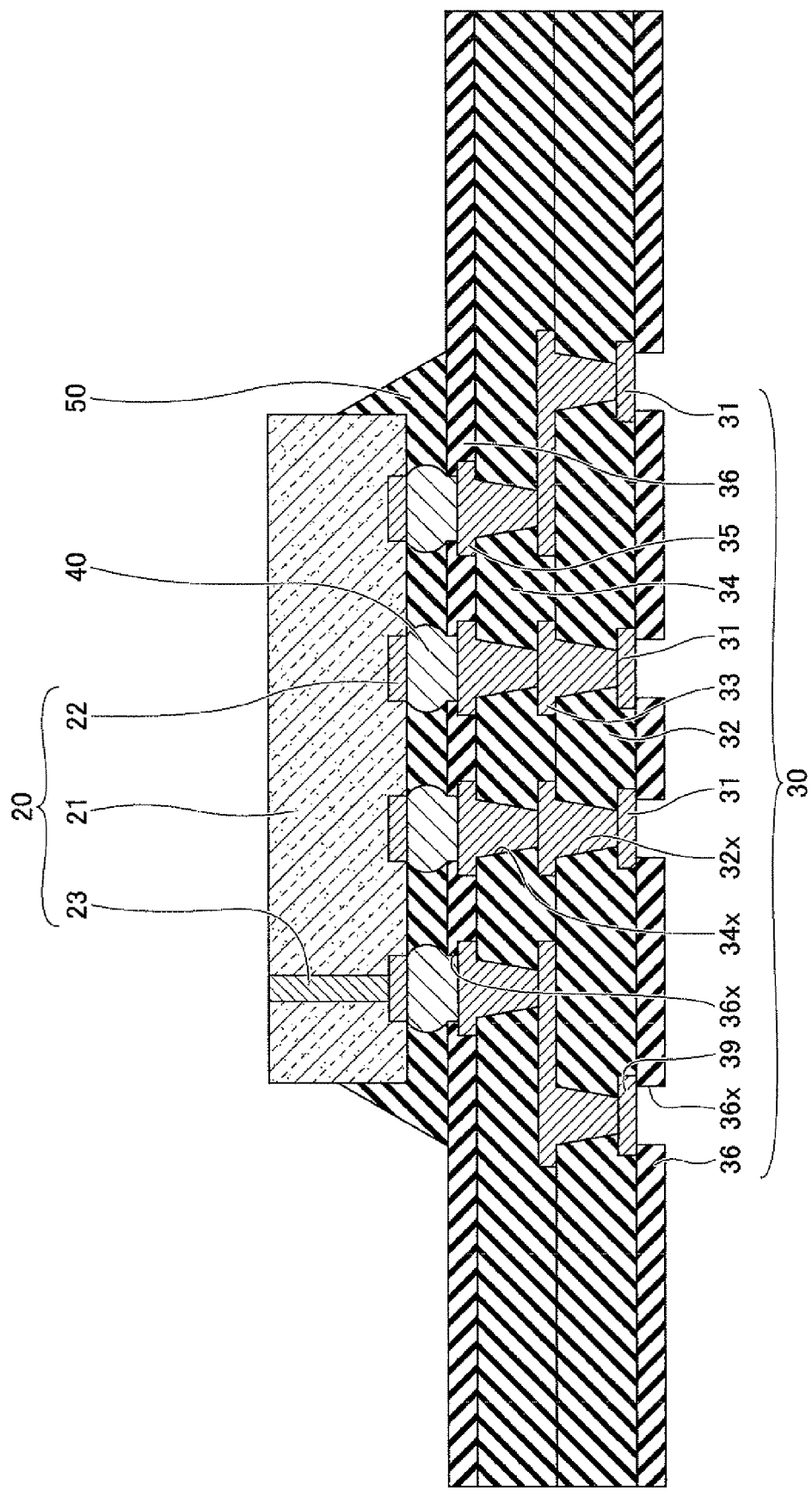

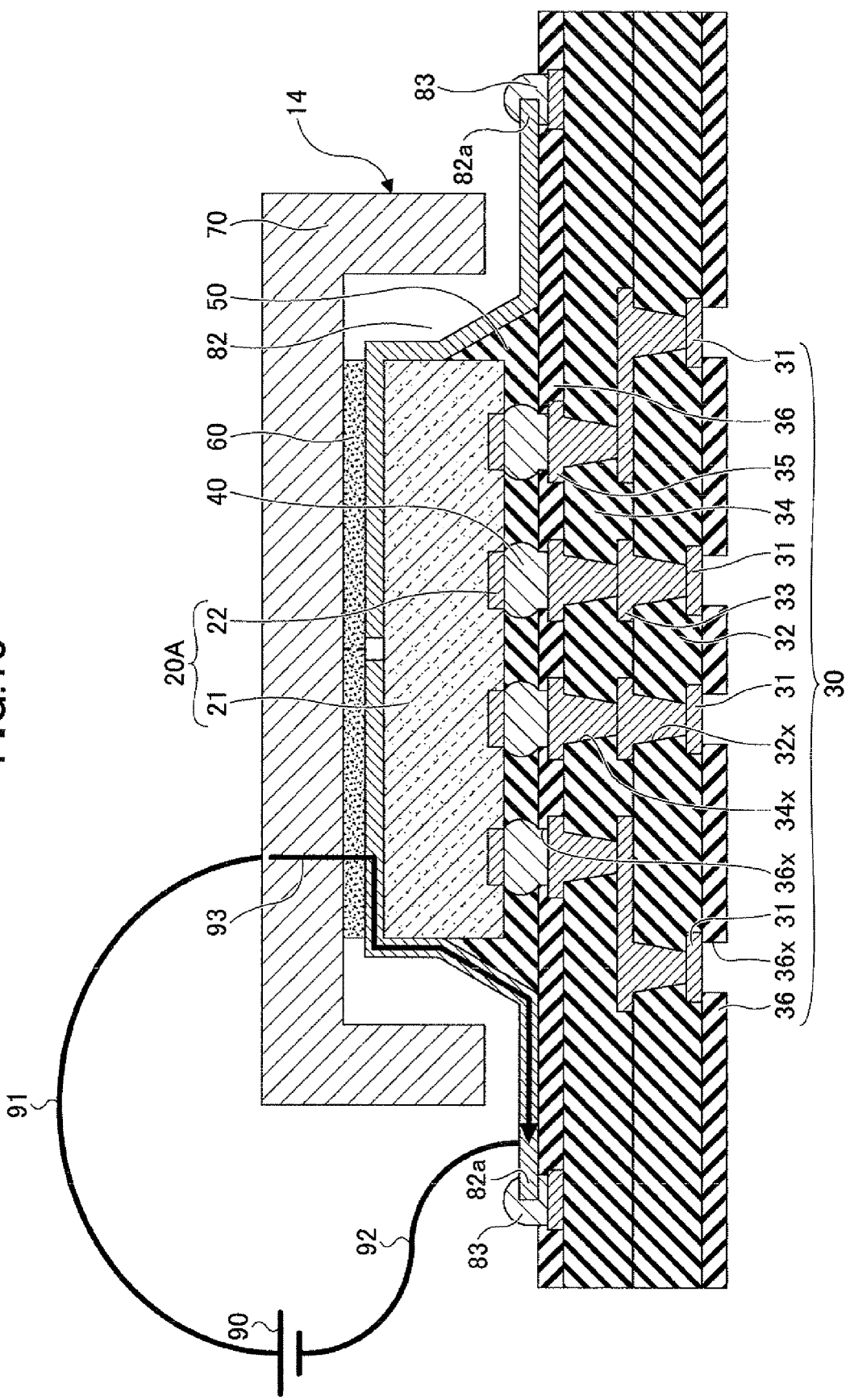

SEMICONDUCTOR PACKAGE, METHOD OF EVALUATING SAME, AND METHOD OF MANUFACTURING SAME

CROSS-REFERENCE TO RELATED APPLICATION

The present application is based upon and claims the benefit of priority of the prior Japanese Patent Application No. 2009-252170, filed on Nov. 2, 2009, the entire contents of which are incorporated herein by reference.

FIELD

The embodiments discussed herein are related to a semiconductor package having a thermal interface material (TIM), a method of evaluating the semiconductor package, and a method of manufacturing the semiconductor package.

BACKGROUND

A semiconductor device used as a central processing unit (CPU) or the like is electrically connected to and fixed on a board in a semiconductor package. The temperature of the semiconductor device becomes high at the time of its operation. Therefore, the semiconductor device may be damaged unless its temperature is forcibly reduced. Accordingly, a heat spreader or a radiator fin (or a heat pipe) is attached on the semiconductor device to ensure a path for effectively radiating heat generated by the semiconductor device to its outside. Attempts have been made at smooth heat conduction by interposing a thermal interface material (TIM) between the semiconductor device and the heat spreader or the like so that the thermal interface material follows their respective uneven surfaces to reduce thermal contact resistance.

FIG. 1 is a cross-sectional view of a conventional semiconductor package including a thermal interface material. In the semiconductor package, heat generated by a semiconductor device 200 mounted on a board 100 is transferred to a heat spreader 400 via a thermal interface material 300a provided on the semiconductor device 200. Further, the heat transferred to the heat spreader 400 is transferred to a radiator fin 500 via a thermal interface material 300b provided on the heat spreader 400.

Thus, the thermal interface materials 300a and 300b are used as means for thermally connecting the semiconductor device 200 and the heat spreader 400 and thermally connecting the heat spreader 400 and the radiator fin 500.

Reference may be made to Japanese Laid-Open Patent Application No. 57-039364 for related art.

SUMMARY

According to an aspect of the invention, a semiconductor package includes a wiring board; a semiconductor device mounted on the wiring board; an electrically-conductive thermal interface material provided on the semiconductor device; a test electrode in contact with a first surface of the thermal interface material to be electrically connected to the thermal interface material; and an electrically-conductive heat spreader in contact with a second surface of the thermal interface material opposite to the first surface thereof.

According to an aspect of the invention, a method of evaluating a semiconductor package includes measuring an electrical resistance of a part of the semiconductor package from a heat spreader through a test electrode via a thermal interface material provided on the semiconductor device, the test electrode being in contact with a first surface of the thermal interface material to be electrically connected to the thermal interface material, the heat spreader being in contact with a second surface of the thermal interface material opposite to the first surface thereof; and evaluating a magnitude of a thermal contact resistance between the thermal interface material and each of the heat spreader and the semiconductor device based on a measurement of the electrical resistance.

According to an aspect of the invention, a method of manufacturing a semiconductor package includes mounting a semiconductor device on a wiring board; providing an electrically-conductive thermal interface material on the semiconductor device; providing a test electrode in contact with a first surface of the thermal interface material so that the test electrode is electrically connected to the thermal interface material; providing an electrically-conductive heat spreader in contact with a second surface of the thermal interface material opposite to the first surface thereof; and evaluating a magnitude of a thermal contact resistance between the thermal interface material and each of the heat spreader and the semiconductor device by the method of evaluating a semiconductor package as set forth above.

The objects and advantages of the invention will be realized and attained by means of the elements and combinations particularly pointed out in the claims.

It is to be understood that both the foregoing general description and the following detailed description are exemplary and explanatory and not restrictive of the invention as claimed.

BRIEF DESCRIPTION OF THE DRAWINGS

Other objects, features and advantages of the present invention will become more apparent from the following detailed description when read in conjunction with the accompanying drawings, in which:

FIG. 2 is a cross-sectional view of a semiconductor package according to a first embodiment;

FIG. 3 is a diagram for illustrating a method of evaluating the performance of a thermal interface material in a semiconductor package according to the first embodiment;

FIG. 4 is another diagram for illustrating the method of evaluating the performance of a thermal interface material in a semiconductor package according to the first embodiment;

FIGS. 6A and 6B are enlarged views of the circled portion A in FIG. 3 according to the first embodiment;

FIGS. 7A through 7E are diagrams illustrating processes for manufacturing a semiconductor package according to the first embodiment;

FIG. 18 is a diagram for illustrating a method of evaluating the performance of a thermal interface material in a semiconductor package according to the fourth embodiment.

DESCRIPTION OF EMBODIMENTS

Figure 1:
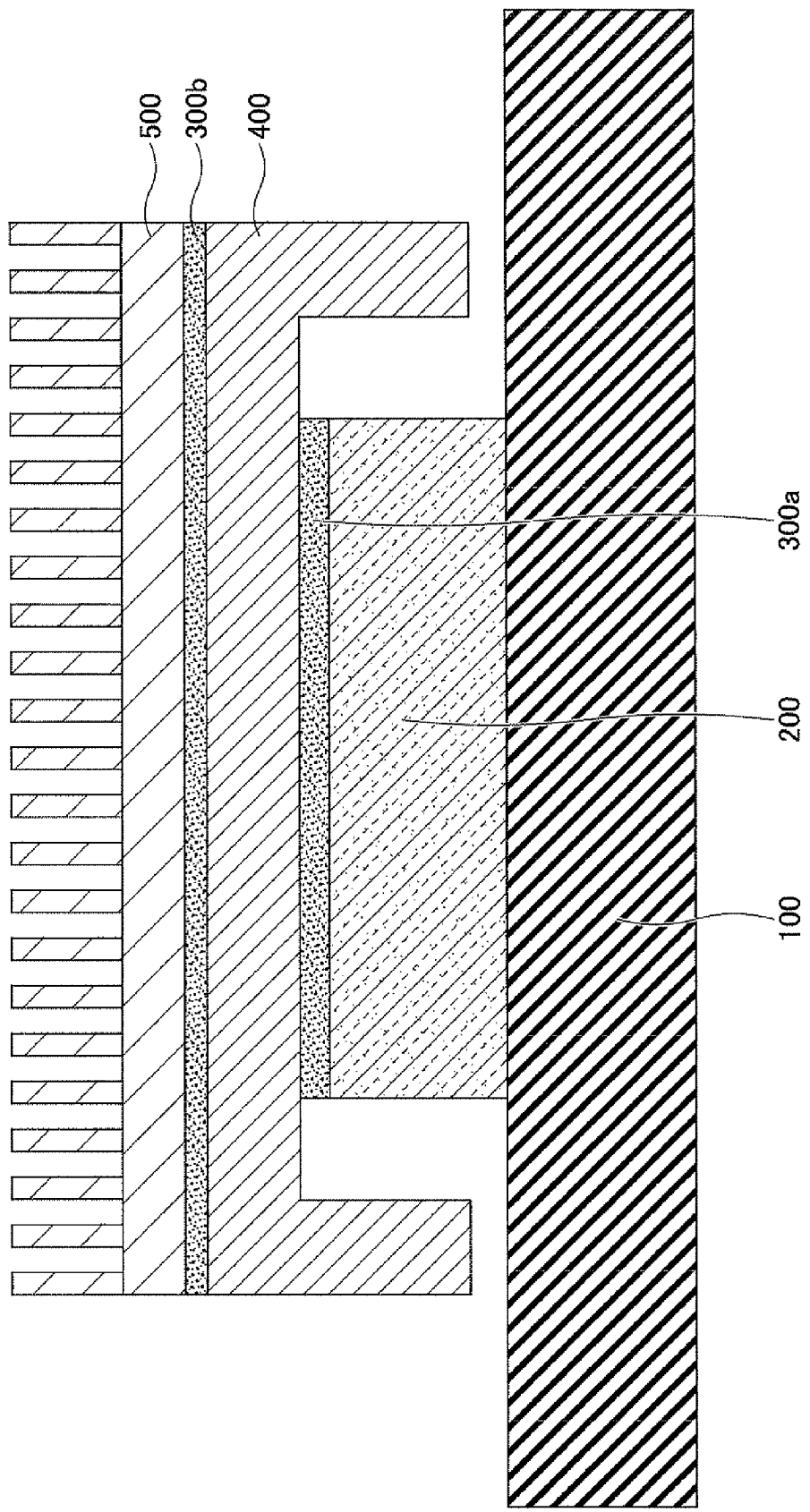
FIG. 1 is a cross-sectional view of a conventional semiconductor package including a thermal interface material.

The thermal contact resistance between a thermal interface material and a semiconductor device or a heat spreader is a factor that determines the performance of the thermal interface material, and it is preferable that the contact thermal resistance be as low as possible. Conventionally, in evaluating the performance of the thermal interface material, thermal resistance is measured that includes the thermal interface material as well as the semiconductor device and the heat spreader, one on each side of the thermal interface material. For example, the semiconductor device is electrically loaded to generate heat, and the internal temperature of the semiconductor device and the surface temperature of the heat spreader are measured. Then, thermal resistance is calculated from a difference between the measured internal temperature of the semiconductor device and the measured surface temperature of the heat spreader.

However, there is a problem in that measurement of thermal contact resistance requires a complicated evaluation system and takes a lot of evaluation time.

According to one aspect of the present invention, a semiconductor package is provided that allows the performance of its thermal interface material to be evaluated in a simple manner, and a method of evaluating the semiconductor package and a method of manufacturing the semiconductor package are provided.

A description is given, with reference to the accompanying drawings, of embodiments of the present invention.

[a] First Embodiment

A description is given of a semiconductor package structure according to a first embodiment.

FIG. 2 is a cross-sectional view of a semiconductor package according to the first embodiment. Referring to FIG. 2, a semiconductor package 10 according to the first embodiment includes a semiconductor device 20, a multilayer wiring (interconnection) board 30, multiple solder bumps 40, underfill resin 50, a thermal interface material (TIM) 60, and a heat spreader 70.

The semiconductor device 20 is substantially centered on the multilayer wiring board 30 via the bumps 40, and is sealed with the underfill resin 50. Further, the semiconductor device 20 is connected to the heat spreader 70 via the thermal interface material 60.

A description is given below of the semiconductor device 20, the multilayer wiring board 30, the solder bumps 40, the underfill resin 50, the thermal interface material 60, and the heat spreader 70.

The semiconductor device 20 includes a semiconductor substrate 21, multiple electrode pads 22, and a through electrode 23. The semiconductor substrate 21 is, for example, a silicon (Si) or germanium (Ge) substrate, in which a semiconductor integrated circuit (not graphically illustrated) is formed. The electrode pads 22 are formed on one side of the semiconductor substrate 21 to be electrically connected to the semiconductor integrated circuit. Examples of the material of the electrode pads 22 include aluminum (Al); copper (Cu) and aluminum stacked in layers in this order; and copper, aluminum, and silicon stacked in layers in this order.

Hereinafter, in the semiconductor device 20, a surface on the side on which the electrode pads 22 are formed may be referred to as a "principal surface," a surface on the side opposite to the principal surface and substantially parallel to the principal surface may be referred to as a "bottom surface," and a surface substantially perpendicular to the principal surface and the bottom surface may be referred to as a "side surface."

The through electrode 23 is formed through the semiconductor substrate 21 from the principal surface side to the bottom surface side. A first end of the through electrode 23 is electrically connected to a corresponding one of the electrode pads 22. A second end of the through electrode 23 is exposed at the bottom surface of the semiconductor substrate 21 (a bottom surface 20a of the semiconductor device 20) to be in contact with a first surface 60a of the thermal interface material 60 on the semiconductor device 20 side. For example, the through electrode 23 is circular in a plan view (taken from the principal surface side or the bottom surface side of the semiconductor substrate 21), and may be, for example, 100 μm in diameter. Examples of the material of the through electrode 23 include copper.

The multilayer wiring board 30 includes a first interconnection layer 31, a first insulating layer 32, a second interconnection layer 33, a second insulating layer 34, and a third interconnection layer 35, which are successively stacked. The multilayer wiring board 30 further includes solder resist layers 36 so formed as to cover the first interconnection layer 31 and the third interconnection layer 35.

The solder resist layers 36 are formed on the first insulating layer 32 and the second insulating layer 34 so as to cover the first interconnection layer 31 and the third interconnection layer 35. The solder resist layers 36 have openings 36x so that the first interconnection layer 31 and the third interconnection layer 35 are partly exposed in the openings 36x of the solder resist layers 36. Examples of the material of the solder resist layers 36 include photosensitive resin compositions containing epoxy resin, imide resin, etc. The solder resist layers 36 may each be, for example, approximately 30 μm in thickness.

A metal layer or the like may be formed on the first interconnection layer 31 and the third interconnection layer 35 in the openings 36x, where the first interconnection layer 31 and the third interconnection layer 35 are exposed, as required. Examples of the metal layer include an Au layer, a Ni/Au layer (a metal layer formed of a Ni layer and a Au layer stacked in this order), a Ni/Pd/Au layer (a metal layer of a Ni layer, a Pd layer, and a Au layer stacked in this order).

Examples of the material of the first interconnection layer 31 include copper. The first interconnection layer 31 may be, for example, approximately 10 μm in thickness. A left end portion of the first interconnection layer 31 in FIG. 2 is referred to as a "test pad 39" for convenience of description. Portions of the first interconnection layer 31 which are not covered with the first insulating layer 32 and exposed serve as electrode pads to be connected to a motherboard or the like.

In the semiconductor package 10, the part of the through electrode 23 through the test pad 39 via the corresponding electrode pad 22, the corresponding solder bump 40, the third interconnection layer 35, and the second interconnection layer 33 is a typical example of the test electrode according to this embodiment. Hereinafter, the above-described part of the through electrode 23 through the test pad 39 may be referred to as "test electrode."

The first insulating layer 32 is so formed as to cover the first interconnection layer 31. Examples of the material of the first insulating layer 32 include epoxy resin and polyimide resin. The first insulating layer 32 may be, for example, approximately 30 μm in thickness.

The second interconnection layer 33 is formed on the first insulating layer 32. The second interconnection layer 33 includes via-filling portions filling in first via holes 32x penetrating through the first insulating layer 32 to expose the upper surface of the first interconnection layer 31, and an interconnection pattern formed on the first insulating layer 32. The second interconnection layer 33 is electrically connected to the first interconnection layer 31 at the first via holes 32x, where the first interconnection layer 31 is exposed. Examples of the material of the second interconnection layer 33 include copper. The interconnection pattern forming the second interconnection layer 33 may be, for example, approximately 10 μm in thickness.

The second insulating layer 34 is so formed on the first insulating layer 32 as to cover the second interconnection layer 33. Examples of the material of the second insulating layer 34 include epoxy resin and polyimide resin. The second insulating layer 34 may be, for example, approximately 30 μm in thickness.

The third interconnection layer 35 is formed on the second insulating layer 34. The third interconnection layer 35 includes via-filling portions filling in second via holes 34x penetrating through the second insulating layer 34 to expose the upper surface of the second interconnection layer 33, and an interconnection pattern formed on the second insulating layer 34. The third interconnection layer 35 is electrically connected to the second interconnection layer 33 at the second via holes 34x, where the second interconnection layer 33 is exposed. Examples of the material of the third interconnection layer 35 include copper. The interconnection pattern forming the third interconnection layer 35 may be, for example, approximately 10 μm in thickness.

In the multilayer wiring board 30, the test pad 39 is electrically connected to the through electrode 23 via the second interconnection layer 33, the third interconnection layer 35, the corresponding solder bump 40, and the corresponding electrode pad 22. This structure may be a feature according to the semiconductor package 10 of this embodiment. A function of this structure is described in detail below in "Method of Evaluating Performance of Thermal Interface Material in Semiconductor Package according to First Embodiment."

The solder bumps 40 electrically connect the third interconnection layer 35 (or the metal layer if the metal layer is formed on the third interconnection layer 35), exposed in the openings 36x of the (upper) solder resist layer 36 of the multilayer wiring board 30, to the electrode pads 22 of the semiconductor device 20. Examples of the material of the solder bumps 40 include alloys including lead (Pb), alloys of tin (Sn) and Cu, alloys of Sn and silver (Ag), and alloys of Sn, Ag, and Cu.

The underfill resin 50 fills in the space between the opposed surfaces of the semiconductor device 20 and the multilayer wiring board 30. Examples of the material of the underfill resin 50 include epoxy resin and polyimide resin.

The thermal interface material 60 is provided on the bottom surface 20a of the semiconductor device 20. The thermal interface material 60 serves to thermally connect the semiconductor device 20 and the heat spreader 70. Examples of the material of the thermal interface material 60 include indium (In), which is a highly electrically conductive material having good thermal conductivity, silicone grease containing a highly electrically conductive material, and an organic resin binder containing metal filler or graphite. Further, the thermal interface material 60 may also be sheet-shaped molded resin containing carbon nanotubes, which are a highly electrically conductive material, arranged in a heat conduction direction. Since the thermal interface material 60 forms part of a path through which electric current flows as described below, the material of the thermal interface material 60 includes a highly electrically conductive material and serves as a conductor. The thermal interface material 60 may be, for example, approximately 10 μm to approximately 200 μm in thickness.

The heat spreader 70 is provided on the thermal interface material 60 (in contact with a second surface 60b of the thermal interface material 60). The heat spreader 70 may be, for example, a radiator plate. A material having high thermal conductivity, such as nickel-plated oxygen-free copper or aluminum, may be used for the heat spreader 70. Since the heat spreader 70 forms part of a path through which electric current flows as described below, the material of the heat spreader 70 serves as a conductor. The heat spreader 70 serves to disperse the density of the heat generated by the semiconductor device 20. Further, since the heat spreader 70 is provided over the semiconductor device 20, the heat spreader 70 serves to mechanically protect the semiconductor device 20. The heat spreader 70 may be approximately 10 mm square to approximately 40 mm square in size in a plan view. The heat spreader 70 may be, for example, approximately 1 mm to approximately 3 mm in thickness.

The semiconductor package 10 according to the first embodiment has a structure as described above. In the semiconductor package 10, however, a radiator fin may be further provided over the heat spreader 70 with a thermal interface material interposed between the heat spreader 70 and the radiator fin. Further, a resin layer may be provided between the peripheral portion of the heat spreader 70 and the multilayer wiring board 30.

[Method of Evaluating Performance of Thermal Interface Material in Semiconductor Package according to First Embodiment]

Next, a description is given of a method of evaluating the performance of a thermal interface material in a semiconductor package according to the first embodiment.

FIG. 3 is a diagram for illustrating a method of evaluating the performance of a thermal interface material in a semiconductor package according to the first embodiment. In FIG. 3, the same elements as those of FIG. 2 are referred to by the same reference numerals, and a description thereof may be omitted.

As illustrated in FIG. 3, a lead 91 is connected to the plus side of a direct-current (DC) power supply 90 and the heat spreader 70, and a lead 92 is connected to the minus side of the DC power supply 90 and the test pad 39. The plus side of the DC power supply 90 and the heat spreader 70 may be connected using a pin or by soldering, for example. The minus side of the DC power supply 90 and the test pad 39 may be connected using a pin or by soldering, for example. It may be arbitrarily determined which of the plus side and the minus side of the DC power supply 90 is connected to the test pad 39 or the heat spreader 70.

FIG. 4 is another diagram for illustrating the method of evaluating the performance of a thermal interface material in a semiconductor package according to the first embodiment. In FIG. 4, the same elements as those of FIG. 2 are referred to by the same reference numerals, and a description thereof may be omitted.

In FIG. 4, an arrow 93 indicates a path in which electric current flows. As described above, since the heat spreader 70 is a conductor, electric current flows through the heat spreader 70. Further, since the thermal interface material 60 is made of indium or contains a highly electrically conductive material such as metal filler, graphite, or carbon nanotubes, the thermal interface material 60 serves as a conductor to allow electric current to flow through the thermal interface material 60.

That is, in FIG. 4, electric current flows through the path indicated by the arrow 93 (the plus side of the DC power supply 90 to the lead 91 to the heat spreader 70 to the thermal interface material 60 to the through electrode 23 to the corresponding electrode pad 22 to the corresponding solder bump 40 to the third interconnection layer 35 to the second interconnection layer 33 to the test pad 39 to the lead 92 to the minus side of the DC power supply 90). The path indicated by the arrow 93 is electrically isolated from the semiconductor integrated circuit (not graphically illustrated) of the semiconductor device 20.

By providing an ammeter (not graphically illustrated) for monitoring electric current flowing through the path indicated by the arrow 93 and a voltmeter (not graphically illustrated) for monitoring the voltage applied across (the part of) the heat spreader 70 through the test pad 39 in the path indicated by the arrow 93, it is possible to measure the electrical resistance of (the part of) the heat spreader 70 through the test pad 39 in the path indicated by the arrow 93.

In the path indicated by the arrow 93, the electrical resistance is substantially constant through the part of the through electrode 23, the corresponding electrode pad 22, the corresponding solder bump 40, the third interconnection layer 35, the second interconnection layer 33, and the test pad 39. However, the electrical resistance of the part of the thermal interface material 60 (where the thermal interface material 60 is in contact with the heat spreader 70 and the semiconductor device 20) varies greatly depending on the state of contact of the highly electrically conductive material contained in the thermal interface material 60 and the heat spreader 70 and the state of contact of the highly electrically conductive material contained in the thermal interface material 60 and the through electrode 23. A description is given of this with reference to FIGS. 5A and 5B and FIGS. 6A and 6B.

Figure 5B:
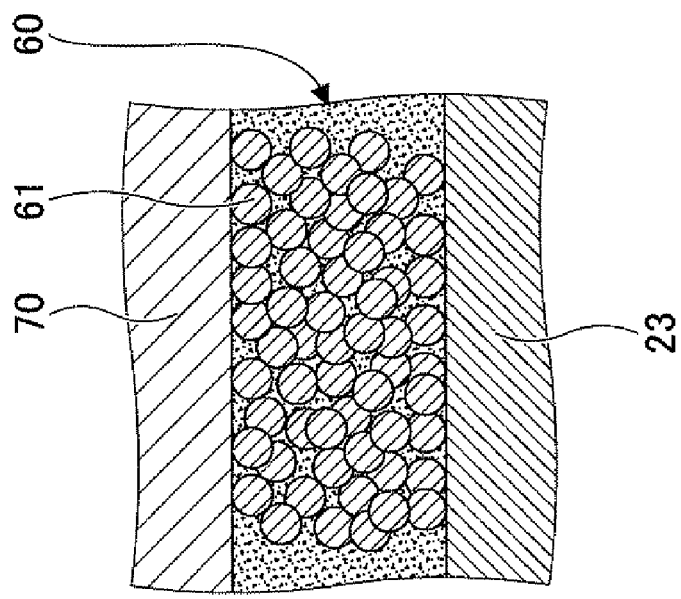
FIGS. 5A and 5B are enlarged views of a circled portion A in FIG. 3 according to the first embodiment.
Figure 5A:
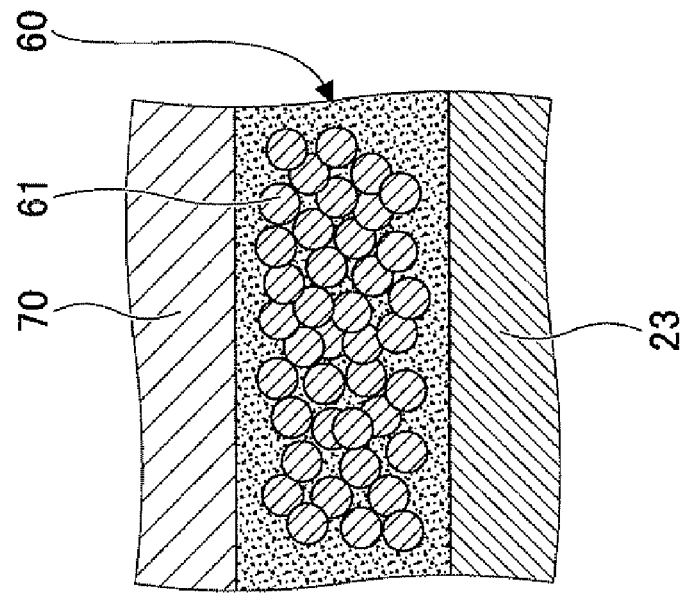

FIGS. 5A and 5B are enlarged views of a circled portion A in FIG. 3, illustrating states of the circled portion A in the case where the thermal interface material 60 is silicone grease containing metal filler or the like as a highly electrically conductive material 61 or the thermal interface material 60 is organic resin containing metal filler or graphite as the highly electrically conductive material 61. In FIGS. 5A and 5B, the same elements as those of FIG. 3 are referred to by the same reference numerals, and a description thereof may be omitted.

FIG. 5A illustrates a case where the highly electrically conductive material 61 is not in sufficient contact with the surface of the through electrode 23 or the surface of the heat spreader 70. In this case, the electrical resistance of the part of the thermal interface material 60 is high. On the other hand, FIG. 5B illustrates a case where the highly electrically conductive material 61 is in sufficient contact with the surface of the through electrode 23 and the surface of the heat spreader 70. In this case, the electrical resistance of the part of the thermal interface material 60 is low.

FIGS. 6A and 6B are enlarged views of the circled portion A in FIG. 3, illustrating states of the circled portion A in the case where the thermal interface material 60 is organic resin containing carbon nanotubes 62 as a highly electrically conductive material. In FIGS. 6A and 6B, the same elements as those of FIG. 3 are referred to by the same reference numerals, and a description thereof may be omitted.

FIG. 6A illustrates a case where the carbon nanotubes are not in sufficient contact with the surface of the through electrode 23 or the surface of the heat spreader 70. In this case, the electrical resistance of the part of the thermal interface material 60 is high. On the other hand, FIG. 6B illustrates a case where the carbon nanotubes 62 are in sufficient contact with the surface of the through electrode 23 and the surface of the heat spreader 70. In this case, the electrical resistance of the part of the thermal interface material 60 is low.

Thus, the electrical resistance of the part of the thermal interface material 60 differs greatly depending on the state of contact of the highly electrically conductive material contained in the thermal interface material 60 and the heat spreader 70 and the state of contact of the highly electrically conductive material contained in the thermal interface material 60 and the through electrode 23. Further, if the highly electrically conductive material is not in sufficient contact with the surface of the through electrode 23 or the surface of the heat spreader 70 as illustrated in FIG. 5A or FIG. 6A, heat is less likely to be transferred from the semiconductor device 20 to the heat spreader 70 via the thermal interface material 60, so that the thermal contact resistance increases. On the other hand, if the highly electrically conductive material is in sufficient contact with the surface of the through electrode 23 and the surface of the heat spreader 70 as illustrated in FIG. 5B or FIG. 6B, heat is likely to be transferred from the semiconductor device 20 to the heat spreader 70 via the thermal interface material 60, so that the thermal contact resistance decreases.

That is, there is a correspondence between the electrical resistance of the part of the thermal interface material 60 and the thermal contact resistance of the part of the thermal interface material 60. Accordingly, if the correspondence between the electrical resistance of the part of the thermal interface material 60 and the thermal contact resistance of the part of the thermal interface material 60 is predetermined or found in advance, it is possible to determine the thermal contact resistance of the part of the thermal interface material 60 by measuring the electrical resistance of the part of the thermal interface material 60 in the individually manufactured semiconductor package 10.

In practice, the thermal contact resistance of the part of the thermal interface material 60 is easily determined by predetermining the correspondence between the electrical resistance of the heat spreader 70 through the test pad 39 in the path indicated by the arrow 93 in FIG. 4 and the thermal contact resistance of the part of the thermal interface material 60 and measuring the electrical resistance of the heat spreader 70 through the test pad 39 in the path indicated by the arrow 93 in the individually manufactured semiconductor package 10.

If it is preknown that the highly electrically conductive material is in sufficient contact with the surface of the through electrode 23 and the surface of the heat spreader 70 as in FIG. 5B or FIG. 6B, it is possible to determine the presence or absence of the delamination of the thermal interface material 60 from the semiconductor device 20 and/or the heat spreader 70 by the method of evaluating the performance of the thermal interface material 60 in the semiconductor package 10 according to the first embodiment.

[Method of Manufacturing Semiconductor Package according to First Embodiment]

Next, a description is given of a method of manufacturing a semiconductor package according to the first embodiment.

FIGS. 7A through 7E are diagrams illustrating processes for manufacturing a semiconductor package according to the first embodiment. In FIGS. 7A through 7E, the same elements as those of FIG. 2 are referred to by the same reference numerals, and a description thereof may be omitted.

Figure 7A:
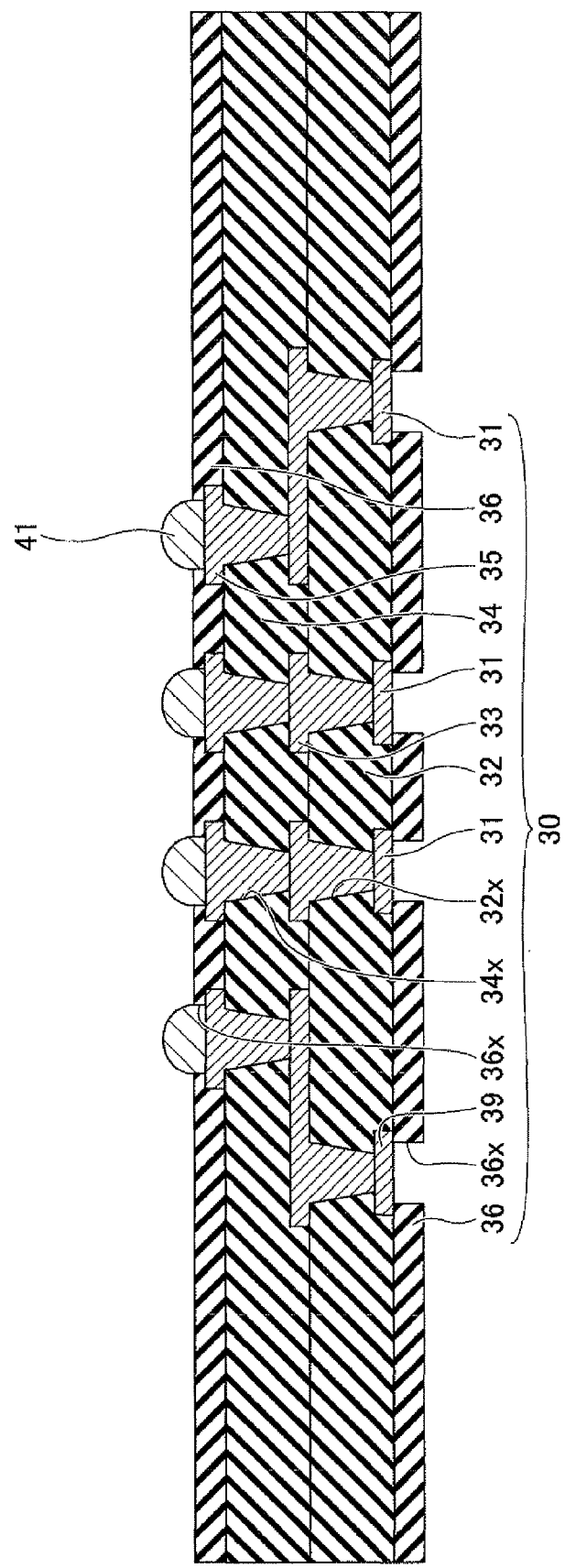

First, in the process illustrated in FIG. 7A, the multilayer wiring board 30 manufactured by a known build-up process is prepared. The details of the multilayer wiring board 30 are as described above. Pre-solder 41 is formed on the third interconnection layer 35 (on a metal layer if the metal layer is formed on the third interconnection layer 35) in the openings 36x, where the third interconnection layer 35 is exposed, of the (upper) solder resist layer 36 of the multilayer wiring board 30. Examples of the material of the pre-solder 41 include alloys containing Pb, alloys of Sn and Cu, alloys of Sn and Ag, and alloys of Sn, Ag, and Cu. The pre-solder 41 may be formed by being provided on the third interconnection layer 35 (on a metal layer if the metal layer is formed on the third interconnection layer 35) on which flux has been applied as a surface treatment agent and then subjected to reflowing at temperatures of approximately 240° C. to approximately 260° C.; and thereafter having its surface washed to have the flux removed.

Figure 7B:
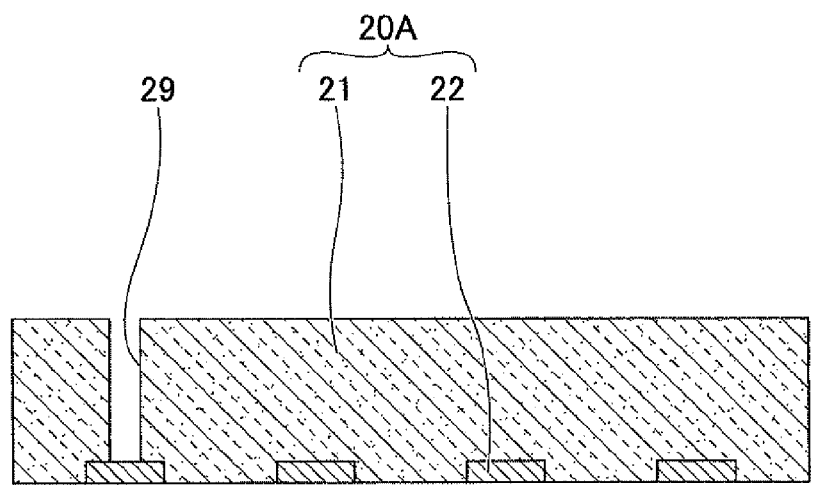

Next, in the process illustrated in FIG. 7B, a semiconductor device 20A having a semiconductor integrated circuit (not graphically illustrated) and the electrode pads 22 formed on the semiconductor substrate 21 is prepared by a known method. Then, a through hole 29 is formed in the semiconductor substrate 21 of the semiconductor device 20A so as to expose a surface of a corresponding one of the electrode pads 22 on one side. The through hole 29 may be circular in a plan view (taken from the principal surface side or the bottom surface side of the semiconductor substrate 21), and may be, for example, 100 μm in diameter. The through hole 29 may be formed by an anisotropic etching process such as deep reactive ion etching (DRIE). With the formation of the below-described through electrode 23, the semiconductor device 20A ultimately becomes the semiconductor device 20.

Figure 7C:
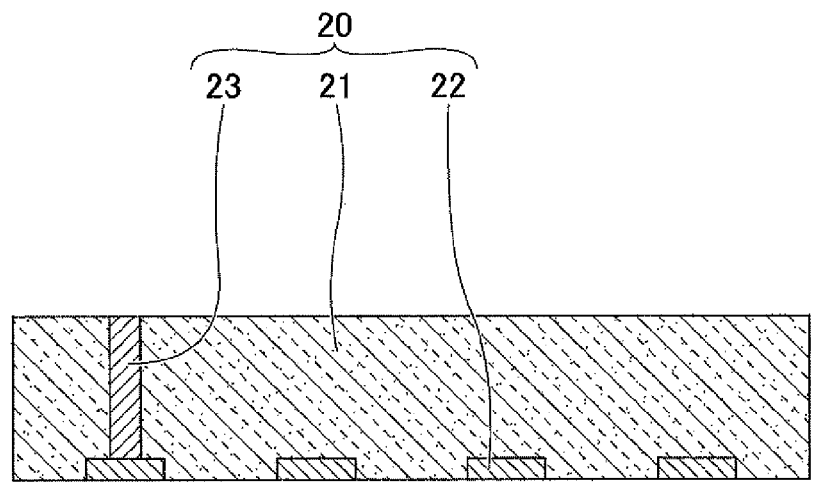

Next, in the process illustrated in FIG. 7C, the through electrode 23 is formed. For example, first, an insulating film (not graphically illustrated) is formed to cover the inner wall surface of the through hole 29. For example, if the semiconductor substrate 21 is silicon, the insulating film may be formed by subjecting the semiconductor substrate 21 to thermal oxidation. The insulating film may be, for example, approximately 0.5 μm to approximately 1.0 μm in thickness. Next, the through electrode 23 is formed by filling the through hole 29 covered with the insulating film with metal. The filling with the metal may be performed by, for example, electroless plating or electroplating. Examples of the material of the filling metal include copper. By this process, the through electrode 23 is formed in the semiconductor device 20A, so that the semiconductor device 20 is completed.

Next, in the process illustrated in FIG. 7D, pre-solder 42 is formed on the electrode pads 22. Then, the third interconnection layer 35 side of the multilayer wiring board 30 and the electrode pads 22 side of the semiconductor device 20 are opposed to each other so that the pre-solder 41 and the pre-solder 42 are placed at respective positions corresponding to each other. Examples of the material of the pre-solder 42 include alloys containing Pb, alloys of Sn and Cu, alloys of Sn and Ag, and alloys of Sn, Ag, and Cu. The pre-solder 42 may be formed by being provided on the electrode pads 22 on which flux has been applied as a surface treatment agent and then subjected to reflowing at temperatures of approximately 240° C. to approximately 260° C.; and thereafter having its surface washed to have the flux removed.

Next, in the process illustrated in FIG. 7E, the pre-solder 41 and the pre-solder 42 are heated to, for example, 230° C. to melt solder, thereby forming the solder bumps 40. Then, the space between the opposed surfaces of the semiconductor device 20 and the multilayer wiring board 30 is filled with the underfill resin 50. Examples of the material of the underfill resin 50 include epoxy resin and polyimide resin.

Next, the thermal interface material 60 is provided on the bottom surface 20a of the semiconductor device 20, and the heat spreader 70 is provided on the thermal interface material 60. Then, the heat spreader 70 is pressed toward the semiconductor device 20, so that the semiconductor package 10 illustrated in FIG. 2 is completed. Examples of the material of the thermal interface material 60 include indium, which has good thermal conductivity, silicone grease containing metal filler or the like, and an organic resin binder containing metal filler, graphite, etc. Further, the thermal interface material 60 may also be sheet-shaped molded resin containing carbon nanotubes arranged in a heat conduction direction. The thermal interface material 60 may be, for example, approximately 10 μm to approximately 200 μm in thickness. An electrically conductive material having high thermal conductivity, such as nickel-plated oxygen-free copper or aluminum, may be used for the heat spreader 70.

Then, the performance of the thermal interface material 60 in the semiconductor package 10 is evaluated. The method of evaluating performance is as described above. The performance evaluation may be performed as one of the processes of a performance test for semiconductor packages such as an open/short test that is normally performed. The performance evaluation may also be performed as an independent process. This makes it possible to ship the individual semiconductor package 10 after checking the performance of the thermal interface material 60, so that it is possible to improve the quality of the semiconductor package 10 at the time of shipment. If it is preknown that the highly electrically conductive material is in sufficient contact with the surface of the through electrode 23 and the surface of the heat spreader 70 as in FIG. 53 or FIG. 6B, it is possible to determine whether there is delamination of the thermal interface material 60 from the semiconductor device 20 and/or the heat spreader 70 by this process.

Thus, in a semiconductor package according to the first embodiment, a test electrode is provided that includes a through electrode penetrating through a semiconductor device and having a first end in contact with a first surface of a thermal interface material on the semiconductor device side; and an interconnection layer of a wiring board, the interconnection layer being electrically connected to the through electrode. This makes it possible to measure the electrical resistance of the part of a heat spreader through the test electrode via the thermal interface material and to evaluate (determine) the magnitude of the thermal contact resistance between the thermal interface material and each of the heat spreader and the semiconductor device based on the measurement of the electrical resistance.

That is, in evaluating the performance of the thermal interface material, there is no need to measure the internal temperature of the semiconductor device and the surface temperature of the heat spreader by causing the semiconductor device to be electrically loaded and generate heat, and to calculate thermal resistance from a difference between the measured internal temperature of the semiconductor device and the measured surface temperature of the heat spreader, as is conventionally performed. As a result, it is possible to avoid a conventional problem in that measurement of thermal resistance requires a complicated evaluation system and takes a lot of evaluation time, so that it is possible to evaluate the performance of the thermal interface material (the thermal contact resistance of the part of the thermal interface material) in a simple manner, and to reduce evaluation time.

Further, by introducing the method of evaluating the performance of a thermal interface material in a semiconductor package according to the first embodiment into a semiconductor package manufacturing process, it is possible to ship semiconductor packages after checking the performance of thermal interface materials in the individual semiconductor packages, so that it is possible to improve the quality of the semiconductor packages at the time of their shipment.

Next, a description is given of a variation according to the first embodiment.

In the variation of the first embodiment, a case is illustrated where a thermal interface material is divided into multiple regions, and the respective regions are provided with corresponding test electrodes.

Figure 8:
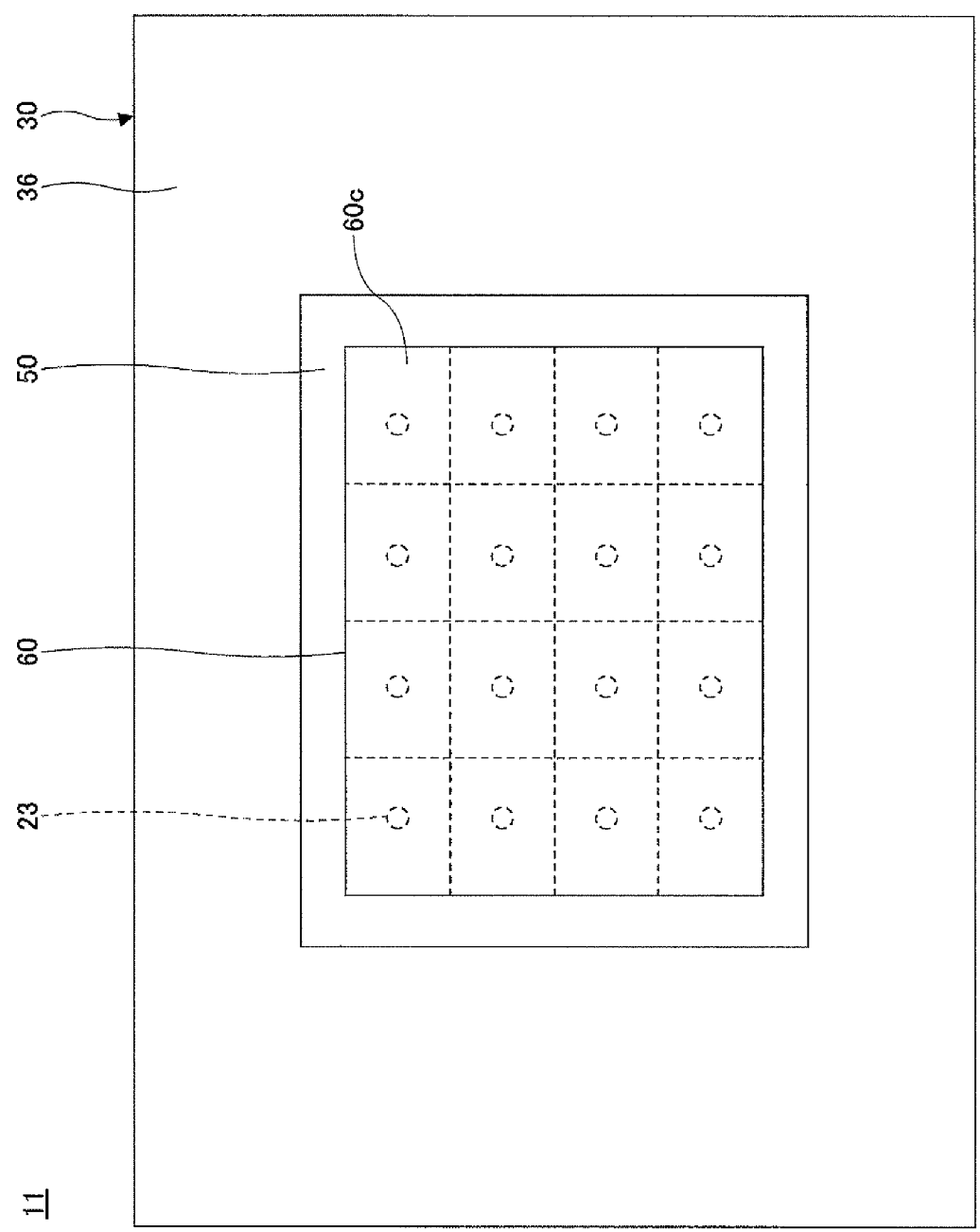
FIG. 8 is a plan view of a semiconductor package according to a variation of the first embodiment.
Figure 9:
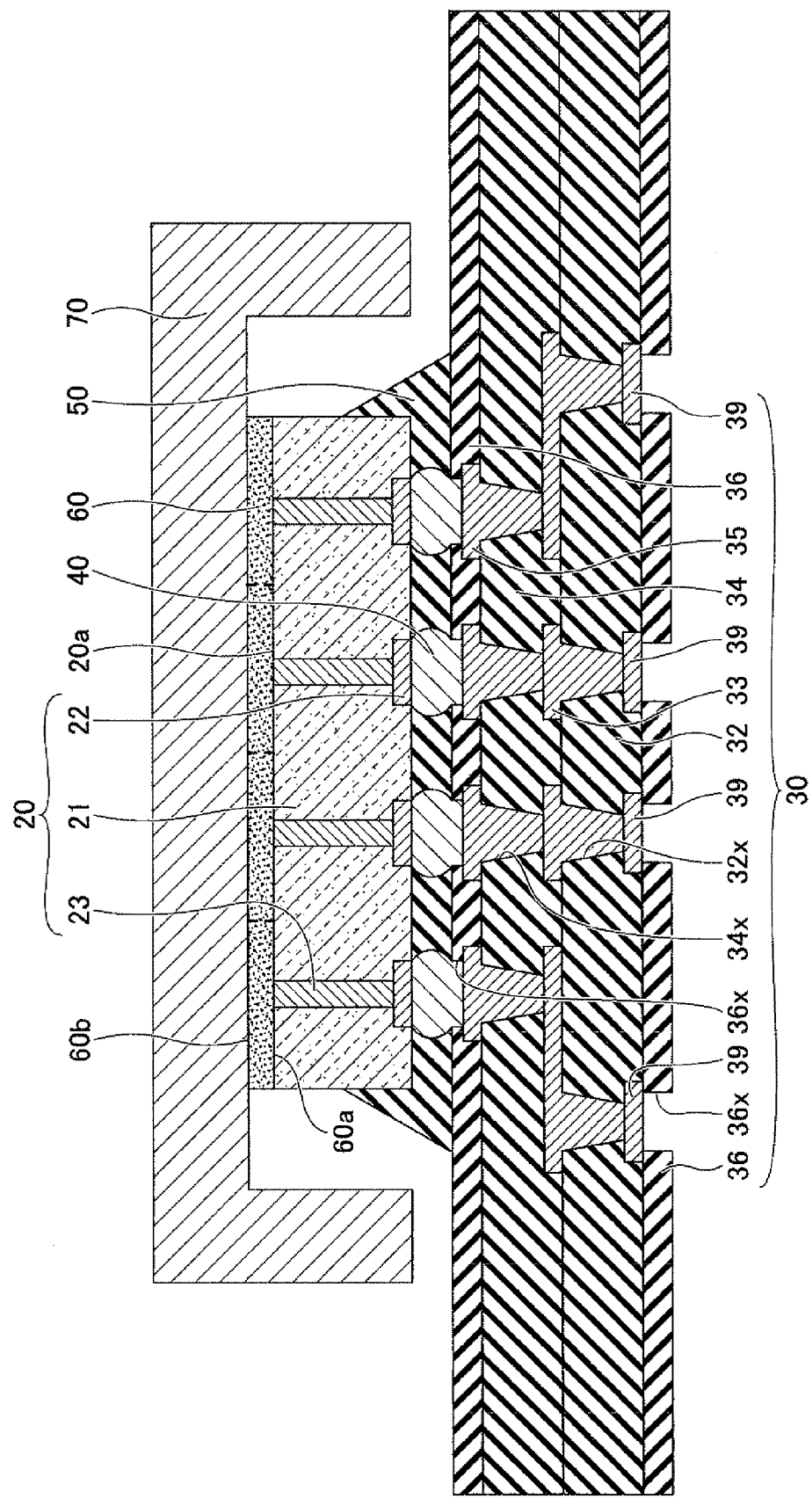
FIG. 9 is a cross-sectional view of the semiconductor package according to the variation of the first embodiment.

FIG. 8 is a plan view of a semiconductor package according to the variation of the first embodiment. FIG. 9 is a cross-sectional view of the semiconductor package according to the variation of the first embodiment. In FIG. 8, the graphical representation of the heat spreader 7 illustrated in FIG. 9 is omitted.

Referring to FIG. 8 and FIG. 9, a semiconductor package 11 according to the variation of the first embodiment is different from the semiconductor package 10 according to this embodiment in that the thermal interface material 60 is divided into 16 regions 60c as indicated by broken lines and that the 16 divided regions 60c are provided with corresponding test electrodes (the through electrodes 23 and the corresponding test pads 39), respectively, but otherwise has the same configuration as the semiconductor package 10. Of the semiconductor package 11, the same elements as those of the semiconductor package 10 are referred to by the same reference numerals, and a description thereof is omitted.

The method of manufacturing the semiconductor package 11 is the same as the method of manufacturing the semiconductor package 10, and accordingly, a description thereof is omitted.

The method of evaluating the performance of a thermal interface material in the semiconductor package 11 is substantially the same as that in the semiconductor package 10. The difference lies in that the performance of the thermal interface material is evaluated on a region-by-region basis by connecting the leads 91 and 92 to the heat spreader 70 and the test pad 39 (connected to the through electrode 23 connected to the thermal interface material 60), respectively, in each of the regions 60c subjected to the evaluation one after another.

Thus, according to the variation of the first embodiment, the same effects as in the first embodiment are produced. Further, according to the variation of the first embodiment, the following effects are additionally produced. That is, by dividing a thermal interface material into multiple regions and providing test electrodes corresponding to the respective regions, it is possible to measure the electrical resistances of multiple paths corresponding to the multiple regions. As a result, it is possible to determine the thermal contact resistance of the part of the thermal interface material region by region. That is, it is possible to understand the state of the thermal contact of the thermal interface material and each of the semiconductor device and the heat spreader on a region-by-region basis.

In the variation of the first embodiment, the thermal interface material 60 is divided into the 16 regions 60c, and the 16 regions 60c are provided with corresponding test electrodes, respectively. Alternatively, it is also possible to divide the thermal interface material 60 into more than or less than 16 regions and provide the regions with respective test electrodes.

[b] Second Embodiment

A description is given of a second embodiment.

Figure 10:
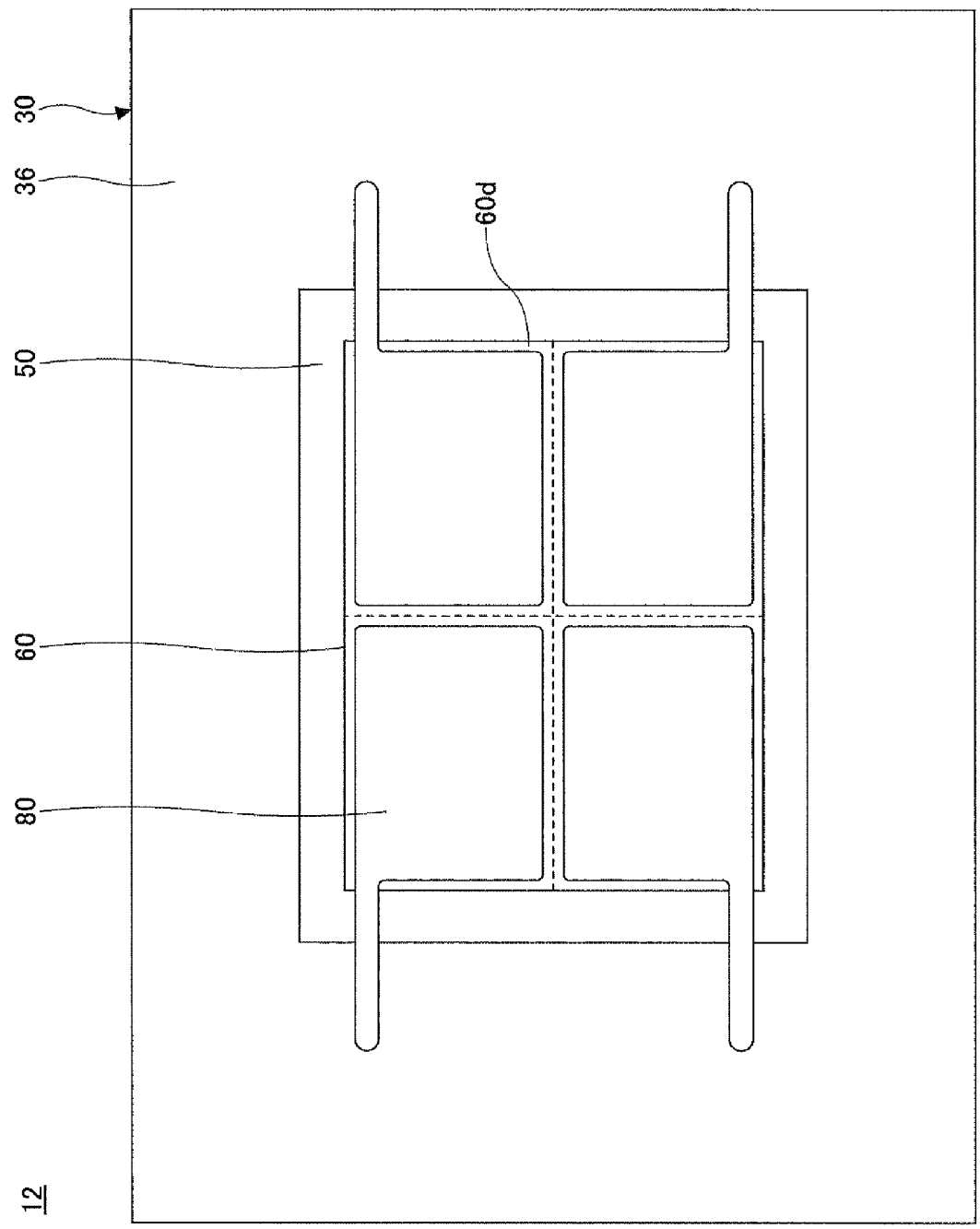
FIG. 10 is a plan view of a semiconductor package according to a second embodiment.
Figure 11:
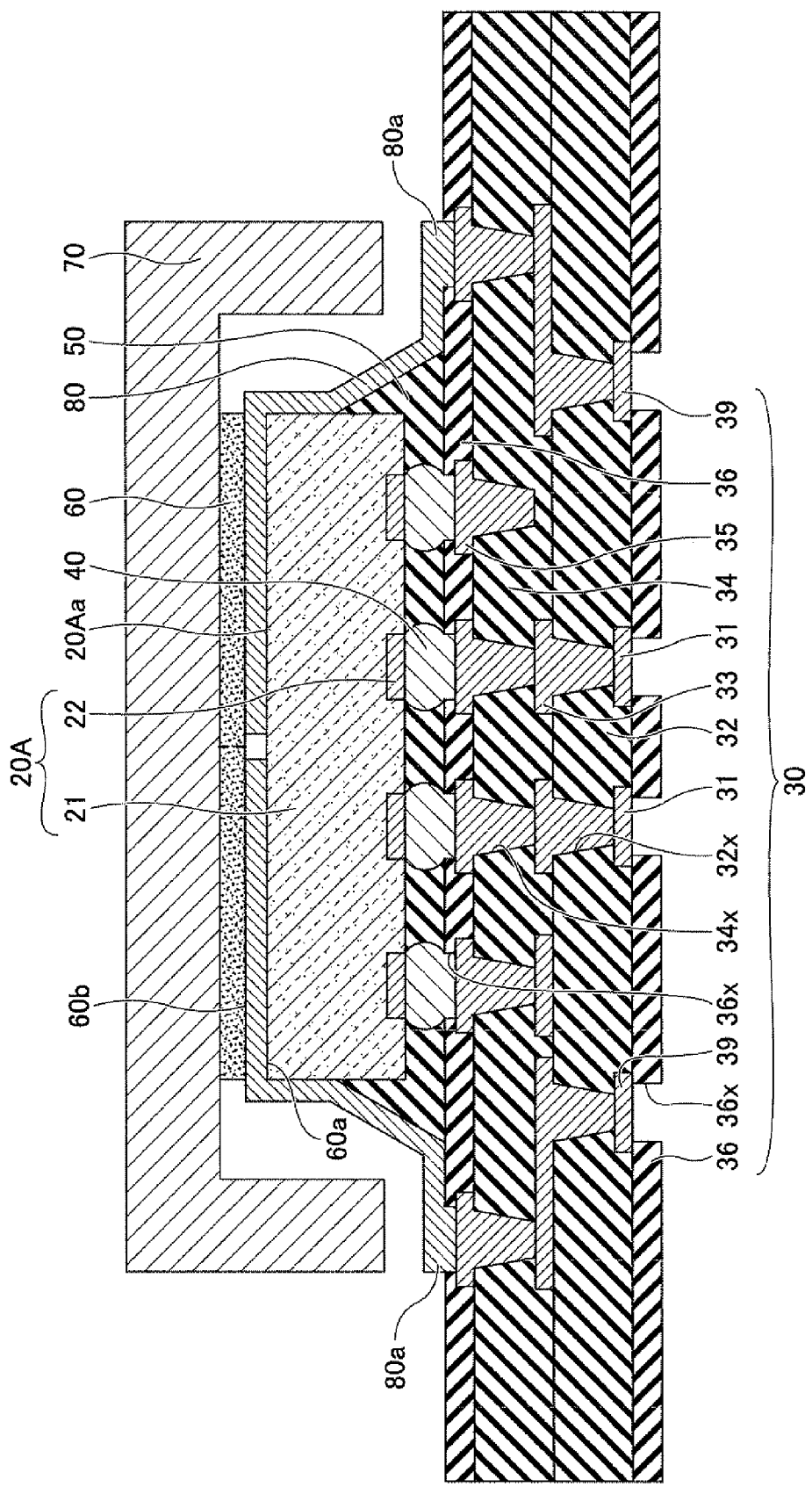
FIG. 11 is a cross-sectional view of the semiconductor package according to the second embodiment.

In the second embodiment, a case is illustrated where the through electrode 23 of the first embodiment is replaced with external electrodes 80. FIG. 10 is a plan view of a semiconductor package according to the second embodiment. FIG. 11 is a cross-sectional view of the semiconductor package according to the second embodiment. In FIG. 10, the graphical representation of the heat spreader 70 illustrated in FIG. 11 is omitted.

Referring to FIG. 10 and FIG. 11, in a semiconductor package 12 according to the second embodiment, the semiconductor device 20 of the first embodiment is replaced with a semiconductor device 20A. That is, the semiconductor package 12 does not include the through electrode 23.

Further, according to the semiconductor package 12, the thermal interface material 60 is divided into four regions 60d as indicated by broken lines in FIG. 10, and the external electrodes 80 are provided on a bottom surface 20Aa of the semiconductor device 20A so as to correspond to the four divided regions 60d. Each of the external electrodes 80 is a metal layer that extends from the bottom surface 20Aa of the semiconductor device 20A over a side surface of the semiconductor device 20A, the underfill resin 50, and the solder resist layer 36. Each of the external electrodes 80 has an end portion 80a electrically connected to the third interconnection layer 35 (or a metal layer if the metal layer is formed on the third interconnection layer 35) in a corresponding one of the openings 36x, where the third interconnection layer 35 is exposed, of the (upper) solder resist layer 36 of the multilayer wiring board 30. Examples of the material of the external electrodes 80 include copper. The external electrodes 80 may be formed by, for example, electroless plating, electroplating, or vapor deposition. In the semiconductor package 12, the part of each external electrode 23 through the corresponding test pad 39 via the third interconnection layer 35 and the second interconnection layer 33 is a typical example of the test electrode according to this embodiment. Hereinafter, the above-described part of the external electrode 80 through the corresponding test pad 39 may be referred to as "test electrode."

The thermal interface material 60 is provided on the external electrodes 80. In the semiconductor package 12, the same elements as those of the semiconductor package 10 of the first embodiment are referred to by the same reference numerals, and a description thereof is omitted.

The method of manufacturing the semiconductor package 12 is substantially the same as the method of manufacturing the semiconductor package 10, but additionally includes the process of forming the external electrodes 80 on the bottom surface 20Aa of the semiconductor device 20A by, for example, electroless plating, electroplating, or vapor deposition.

Figure 12:
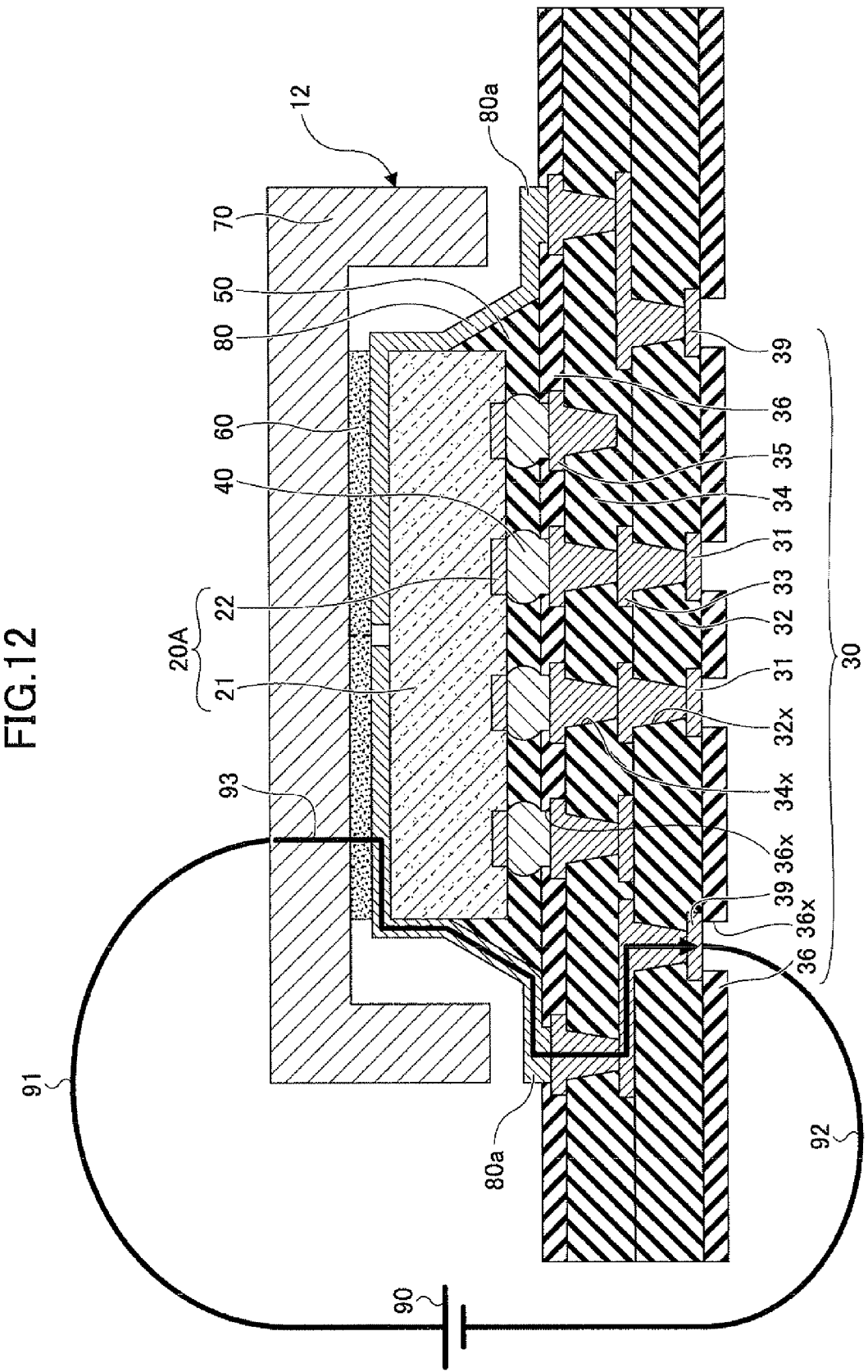
FIG. 12 is a diagram for illustrating a method of evaluating the performance of a thermal interface material in a semiconductor package according to the second embodiment.

The method of evaluating the performance of a thermal interface material in the semiconductor package 12 is substantially the same as that in the semiconductor package 10. The difference lies in that the performance of the thermal interface material is evaluated on a region-by-region basis by connecting the leads 91 and 92 to the heat spreader 70 and the test pad 39 (connected to the external electrode 80), respectively, as illustrated in FIG. 12 in each of the regions 60d subjected to the evaluation one after another.

Thus, according to the second embodiment, the same effects as in the first embodiment are produced. Further, according to the second embodiment, the following effects are additionally produced. That is, an external electrode is provided in a semiconductor package in place of a through electrode. This makes it possible to evaluate the performance of a thermal interface material (the thermal contact resistance of the part of the thermal interface material) in the semiconductor package without executing the process of providing the through electrode in a semiconductor device.

Further, the thermal interface material is divided into multiple regions, and the multiple regions are provided with corresponding test electrodes. This makes it possible to measure the electrical resistances of multiple paths corresponding to the multiple regions. As a result, it is possible to evaluate the magnitude of the thermal contact resistance between the thermal interface material and each of the heat spreader and the semiconductor device on a region-by-region basis. That is, it is possible to understand the state of the thermal contact of the thermal interface material and each of the semiconductor device and the heat spreader on a region-by-region basis.

In the second embodiment, the thermal interface material 60 is divided into the four regions 60d, and the four regions 60d are provided with as many corresponding test electrodes. Alternatively, the thermal interface material 60 may not be divided into four regions, and a single test electrode may be provided. Further, it is also possible to divide the thermal interface material 60 into more than or less than four regions and provide the regions with respective test electrodes.

[c] Third Embodiment

Figure 13:
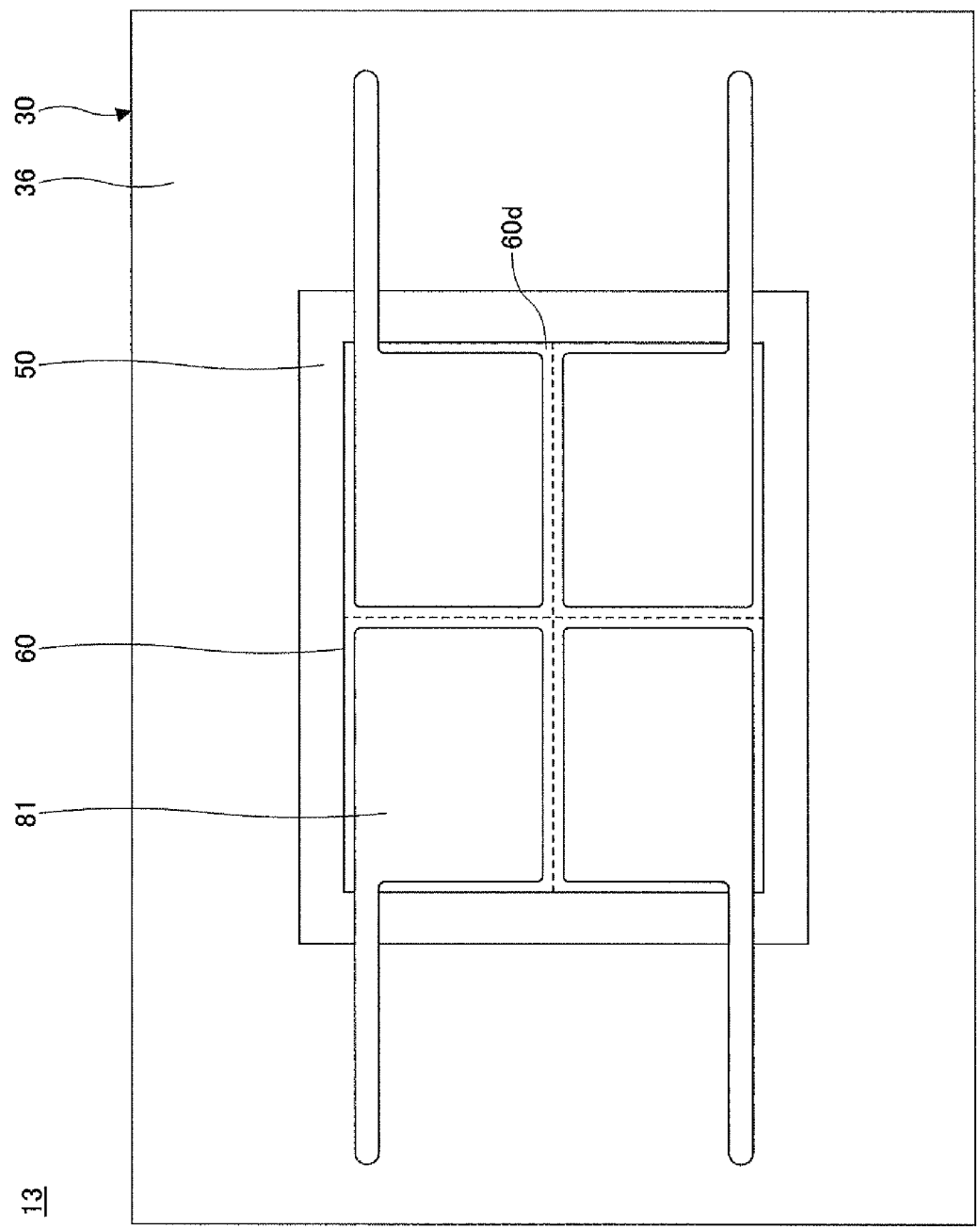
FIG. 13 is a plan view of a semiconductor package according to a third embodiment.
Figure 14:
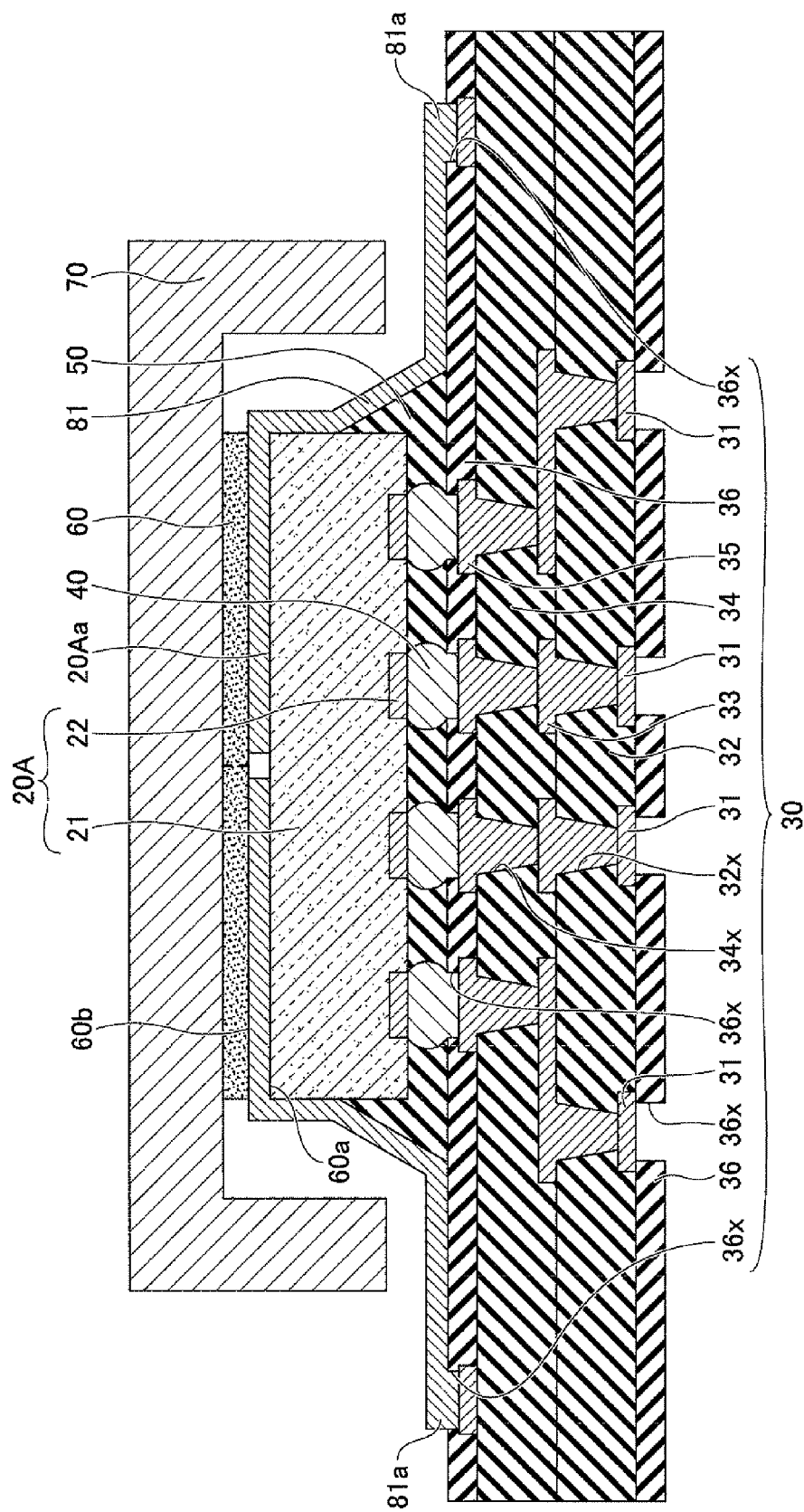
FIG. 14 is a cross-sectional view of the semiconductor package according to the third embodiment.

A description is given of a third embodiment. In the third embodiment, a case is illustrated where the through electrode 23 of the first embodiment is replaced with external electrodes 81. FIG. 13 is a plan view of a semiconductor package according to the third embodiment. FIG. 14 is a cross-sectional view of the semiconductor package according to the third embodiment. In FIG. 13, the graphical representation of the heat spreader 70 illustrated in FIG. 14 is omitted.

Referring to FIG. 13 and FIG. 14, in a semiconductor package 13 according to the third embodiment, the semiconductor device 20 of the first embodiment is replaced with the semiconductor device 20A. That is, the semiconductor package 13 does not include the through electrode 23.

Further, according to the semiconductor package 13, the thermal interface material 60 is divided into the four regions 60d as indicated by broken lines in FIG. 13, and the external electrodes 81 are provided on the bottom surface 20Aa of the semiconductor device 20A so as to correspond to the four divided regions 60d. Each of the external electrodes 81 is a metal layer that extends from the bottom surface 20Aa of the semiconductor device 20A over a side surface of the semiconductor device 20A, the underfill resin 50, and the solder resist layer 36, so as to have an end portion 81a electrically connected to the third interconnection layer 35 (or a metal layer if the metal layer is formed on the third interconnection layer 35) in a corresponding one of the openings 36x, where the third interconnection layer 35 is exposed, of the (upper) solder resist layer 36 of the multilayer wiring board 30. The external electrodes 81 have their respective end portions 81a positioned on the outer side compared with the heat spreader 70.

The end portions 81a of the external electrodes 81 do not necessarily have to be electrically connected to the third interconnection layer 35 (or a metal layer if the metal layer is formed on the third interconnection layer 35) in the corresponding openings 36x, where the third interconnection layer 35 is exposed, of the (upper) solder resist layer 36 of the multilayer wiring board 30, and may be fixed to the multilayer wiring board 30.

Portions of the third interconnection layer 35 to which the external electrodes 81 are connected are not electrically connected to the first interconnection layer 31 of the multilayer wiring board 30, so that the external electrodes 81 are not electrically connected to the first interconnection layer 31 of the multilayer wiring board 30 via the third interconnection layer 35. That is, the semiconductor package 13 does not have the test pad 39. The lead 92 is connected directly to each of the external electrodes 81. Examples of the material of the external electrodes 81 include copper. The external electrodes 81 may be formed by, for example, electroless plating, electroplating, or vapor deposition. In the semiconductor package 13, the external electrodes 81 are typical examples of the test electrode according to this embodiment. Hereinafter, the external electrodes 81 may be referred to as "test electrodes."

The thermal interface material 60 is provided on the external electrodes 81. In the semiconductor package 13, the same elements as those of the semiconductor package 10 of the first embodiment are referred to by the same reference numerals, and a description thereof is omitted.

The method of manufacturing the semiconductor package 13 is substantially the same as the method of manufacturing the semiconductor package 10, but additionally includes the process of forming the external electrodes 81 on the bottom surface 20Aa of the semiconductor device 20A by, for example, electroless plating, electroplating, or vapor deposition.

Figure 15:
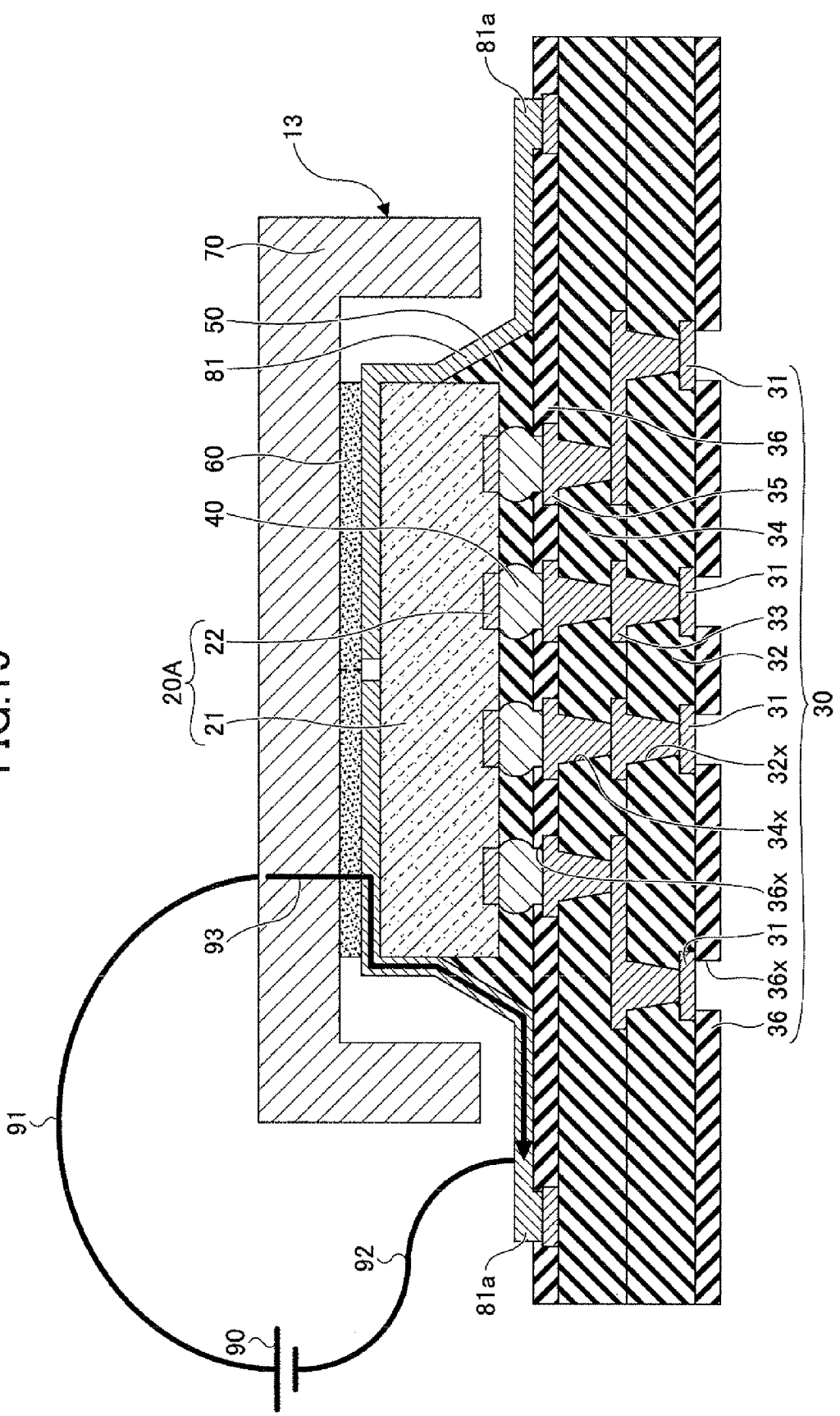
FIG. 15 is a diagram for illustrating a method of evaluating the performance of a thermal interface material in a semiconductor package according to the third embodiment.

The method of evaluating the performance of a thermal interface material in the semiconductor package 13 is substantially the same as that in the semiconductor package 10. The difference lies in that the performance of the thermal interface material is evaluated on a region-by-region basis by connecting the leads 91 and 92 to the heat spreader 70 and the external electrode 81, respectively, as illustrated in FIG. 15 in each of the regions 60d subjected to the evaluation one after another.

Thus, according to the third embodiment, the same effects as in the first embodiment are produced. Further, according to the second embodiment, the following effects are additionally produced. That is, an external electrode is provided in a semiconductor package in place of a through electrode. This makes it possible to evaluate the performance of a thermal interface material (the thermal contact resistance of the part of the thermal interface material) in the semiconductor package without executing the process of providing the through electrode in a semiconductor device.

Further, the thermal interface material is divided into multiple regions, and the multiple regions are provided with corresponding test electrodes. This makes it possible to measure the electrical resistances of multiple paths corresponding to the multiple regions. As a result, it is possible to evaluate the magnitude of the thermal contact resistance between the thermal interface material and each of the heat spreader and the semiconductor device on a region-by-region basis. That is, it is possible to understand the state of the thermal contact of the thermal interface material and each of the semiconductor device and the heat spreader on a region-by-region basis.

Further, the external electrode has an end portion positioned on the outer side than the heat spreader. This makes it possible to measure the electrical resistance of a predetermined path without providing a test pad corresponding to the external electrode.

In the third embodiment, the thermal interface material 60 is divided into the four regions 60d, and the four regions 60d are provided with as many corresponding test electrodes. Alternatively, the thermal interface material 60 may not be divided into four regions, and a single test electrode may be provided. Further, it is also possible to divide the thermal interface material 60 into more than or less than four regions and provide the regions with respective test electrodes.

[d] Fourth Embodiment

A description is given of a fourth embodiment.

Figure 16:
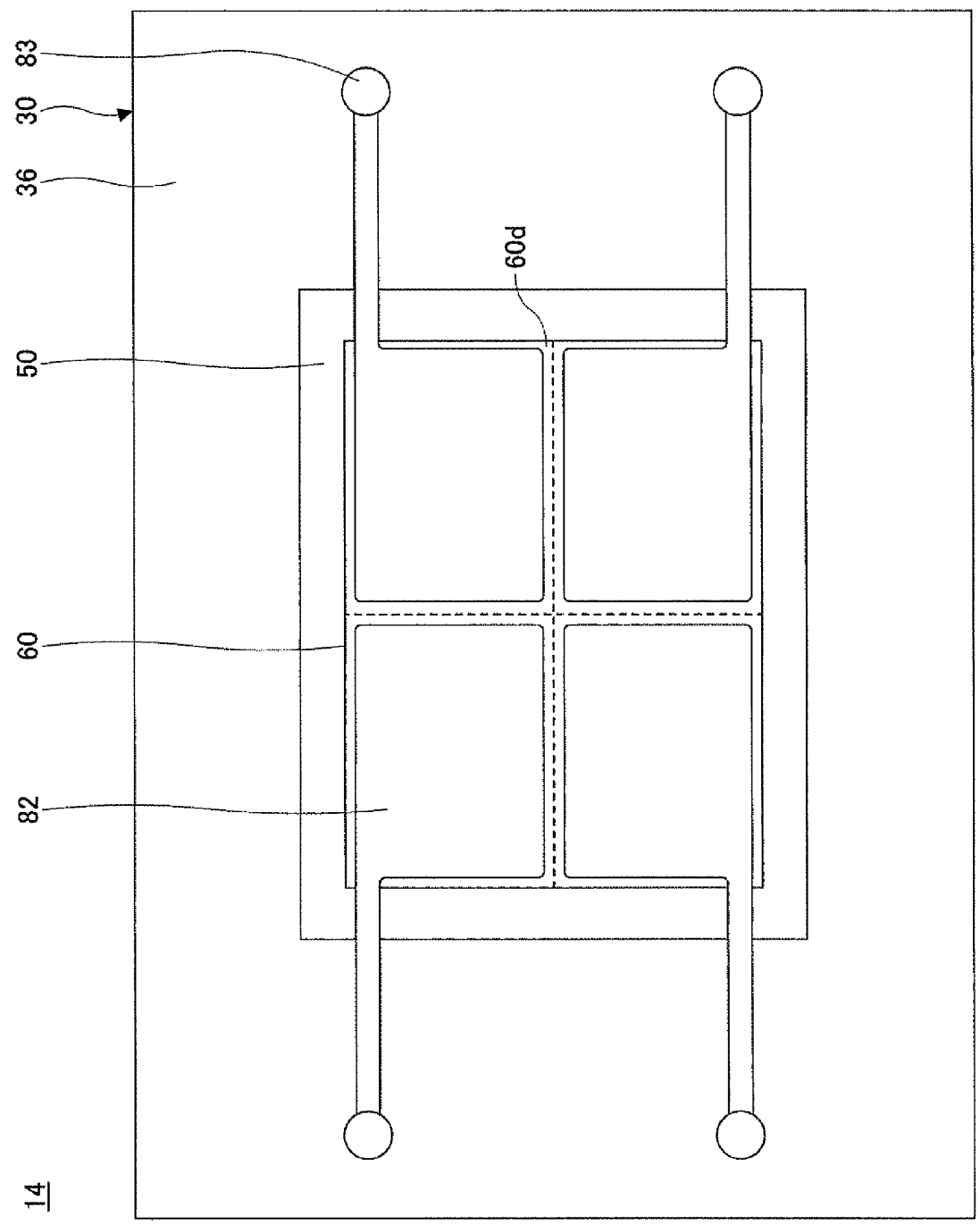
FIG. 16 is a plan view of a semiconductor package according to a fourth embodiment.
Figure 17:
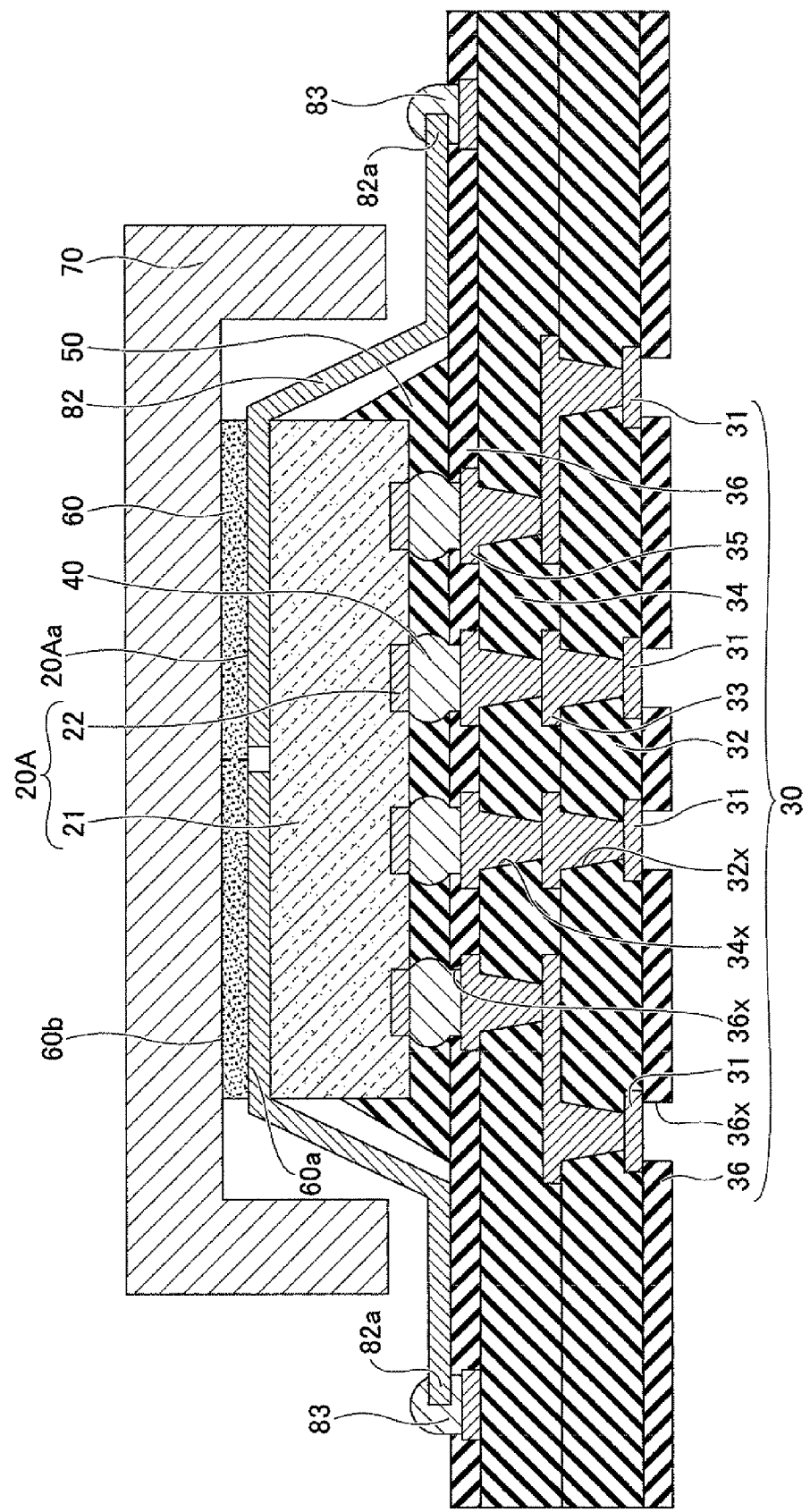
FIG. 17 is a cross-sectional view of the semiconductor package according to the fourth embodiment.

In the fourth embodiment, a case is illustrated where the through electrode 23 of the first embodiment is replaced with external electrodes 82. FIG. 16 is a plan view of a semiconductor package according to the fourth embodiment. FIG. 17 is a cross-sectional view of the semiconductor package according to the fourth embodiment. In FIG. 16, the graphical representation of the heat spreader 70 illustrated in FIG. 17 is omitted.

Referring to FIG. 16 and FIG. 17, in a semiconductor package 14 according to the fourth embodiment, the semiconductor device 20 of the first embodiment is replaced with the semiconductor device 20A. That is, the semiconductor package 14 does not include the through electrode 23.

Further, according to the semiconductor package 14, the thermal interface material 60 is divided into the four regions 60d as indicated by broken lines in FIG. 16, and the external electrodes 82 are provided on the bottom surface 20Aa of the semiconductor device 20A so as to correspond to the four divided regions 60d. The external electrodes 82 are adhered and fixed to the bottom surface 20Aa of the semiconductor device 20A with an electrically conductive adhesive agent (not graphically illustrated) such as silver paste. The external electrodes 82 have respective end portions 82a adhered and fixed, with solder 83, onto the third interconnection layer 35 (or a metal layer if the metal layer is formed on the third interconnection layer 35) in the corresponding openings 36x, where the third interconnection layer 35 is exposed, of the (upper) solder resist layer 36 of the multilayer wiring board 30.

The end portions 82a of the external electrodes 82 do not necessarily have to be adhered and fixed, with solder 83, onto the third interconnection layer 35 (or a metal layer if the metal layer is formed on the third interconnection layer 35) in the corresponding openings 36x, where the third interconnection layer 35 is exposed, of the (upper) solder resist layer 36 of the multilayer wiring board 30, and may be fixed to the multilayer wiring board 30.

Portions of the third interconnection layer 35 to which the external electrodes 82 are connected are not electrically connected to the first interconnection layer 31 of the multilayer wiring board 30, so that the external electrodes 82 are not electrically connected to the first interconnection layer 31 of the multilayer wiring board 30 via the third interconnection layer 35. That is, the semiconductor package 14 does not have the test pad 39. The lead 92 is connected directly to each of the external electrodes 82.

The external electrodes 82 may be, for example, pressed metal plates formed of a material having good thermal and electrical conductivities, such as copper. Examples of the material of the solder 83 include alloys containing Pb, alloys of Sn and Cu, alloys of Sn and Ag, and alloys of Sn, Ag, and Cu. The external electrodes 82 are typical examples of the test electrode according to this embodiment. Hereinafter, the external electrodes 82 may be referred to as "test electrodes."

The thermal interface material 60 is provided on the external electrodes 82. In the semiconductor package 14, the same elements as those of the semiconductor package 10 of the first embodiment are referred to by the same reference numerals, and a description thereof is omitted.

The method of manufacturing the semiconductor package 14 is substantially the same as the method of manufacturing the semiconductor package 10, but additionally includes the process of adhering and fixing the external electrodes 82 onto the bottom surface 20Aa of the semiconductor device 20A with an electrically conductive adhesive agent such as silver paste and the process of adhering and fixing the end portions 82a of the external electrodes 82, with the solder 83, onto the third interconnection layer 35 (or a metal layer if the metal layer is formed on the third interconnection layer 35) in the corresponding openings 36x, where the third interconnection layer 35 is exposed, of the (upper) solder resist layer 36 of the multilayer wiring board 30.

The method of evaluating the performance of a thermal interface material in the semiconductor package 14 is substantially the same as that in the semiconductor package 10. The difference lies in that the performance of the thermal interface material is evaluated on a region-by-region basis by connecting the leads 91 and 92 to the heat spreader 70 and the external electrode 82, respectively, as illustrated in FIG. 18 in each of the regions 60d subjected to the evaluation one after another.

Thus, according to the fourth embodiment, the same effects as in the first embodiment are produced. Further, according to the second embodiment, the following effects are additionally produced. That is, an external electrode formed of a metal plate or the like is provided in a semiconductor package in place of a through electrode. This makes it possible to evaluate the performance of a thermal interface material (the thermal contact resistance of the part of the thermal interface material) in the semiconductor package without executing the process of providing the through electrode in a semiconductor device or performing electroless plating on the semiconductor device.

Further, the thermal interface material is divided into multiple regions, and the multiple regions are provided with corresponding test electrodes. This makes it possible to measure the electrical resistances of multiple paths corresponding to the multiple regions. As a result, it is possible to evaluate the magnitude of the thermal contact resistance between the thermal interface material and each of the heat spreader and the semiconductor device on a region-by-region basis. That is, it is possible to understand the state of the thermal contact of the thermal interface material and each of the semiconductor device and the heat spreader on a region-by-region basis.

In the fourth embodiment, the thermal interface material 60 is divided into the four regions 60d, and the four regions 60d are provided with as many corresponding test electrodes. Alternatively, the thermal interface material 60 may not be divided into four regions, and a single test electrode may be provided. Further, it is also possible to divide the thermal interface material 60 into more than or less than four regions and provide the regions with respective test electrodes.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present inventions have been described in detail, it should be understood that various changes, substitutions, and alterations could be made hereto without departing from the spirit and scope of the invention.

For example, in each of the first through fourth embodiments, a semiconductor package is illustrated that has a semiconductor device and a multilayer wiring board connected via solder bumps. However, the present invention may also be applied to semiconductor packages where a semiconductor device and a multilayer wiring board are connected by other methods such as gold bumps, and to semiconductor packages where a semiconductor device and a multilayer wiring board are directly connected.

Further, the present invention may also be applied to semiconductor packages other than those having a coreless multilayer wiring board manufactured by a build-up process. For example, the present invention may be applied to semiconductor packages having various types of wiring boards such as a multilayer wiring board having a core part manufactured by a build-up process, a single-sided (single-layer) wiring board having an interconnection layer formed on only one side of the board, a double-sided (two-layer) wiring board having an interconnection layer formed on each side of the board, a multilayer wiring board having interconnection layers connected with through vias, and an interstitial via hole (IVH) multilayer wiring board having particular interconnection layers connected with an IVH.

What is claimed is:

1. A semiconductor package, comprising:
    a wiring board;
    a semiconductor device mounted on the wiring board;
    an electrically-conductive thermal interface material provided on the semiconductor device;
    a test electrode in contact with a first surface of the thermal interface material to be electrically connected to the thermal interface material,
    the test electrode including
        a through electrode penetrating through the semiconductor device to have an end thereof in contact with the first surface of the thermal interface material; and
        an interconnection layer of the wiring board, the interconnection layer being electrically connected to the through electrode; and
    an electrically-conductive heat spreader in contact with a second surface of the thermal interface material opposite to the first surface thereof.

2. The semiconductor package as claimed in claim 1, wherein
    the test electrode is extended via the interconnection layer to a surface of the wiring board facing away from the semiconductor device.

3. The semiconductor package as claimed in claim 1, wherein the test electrode comprises a plurality of individual test electrodes,
    the thermal interface material is divided into a plurality of regions, and
    the divided regions are provided with the corresponding individual test electrodes.

* * * * *